(12) United States Patent
Wu

(10) Patent No.: US 11,906,549 B1
(45) Date of Patent: Feb. 20, 2024

(54) COMPLIANT PIN PROBES WITH FLAT EXTENSION SPRINGS, METHODS FOR MAKING, AND METHODS FOR USING

(71) Applicant: Microfabrica Inc., Van Nuys, CA (US)

(72) Inventor: Ming Ting Wu, San Jose, CA (US)

(73) Assignee: Microfabrica Inc., Van Nuys, CA (US)

( * ) Notice: Subject to any disclaimer, the term of this patent is extended or adjusted under 35 U.S.C. 154(b) by 13 days.

(21) Appl. No.: 17/682,340

(22) Filed: Feb. 28, 2022

Related U.S. Application Data

(63) Continuation of application No. 17/139,940, filed on Dec. 31, 2020, now abandoned.

(60) Provisional application No. 62/961,672, filed on Jan. 15, 2020, provisional application No. 62/961,675, filed on Jan. 15, 2020, provisional application No. 62/961,678, filed on Jan. 15, 2020, provisional application No. 62/956,124, filed on Dec. 31, 2019, provisional application No. 62/956,122, filed on Dec. 31, 2019, provisional application No. 62/956,016, filed on Dec. 31, 2019.

(51) Int. Cl.
  *G01R 1/067* (2006.01)
  *G01R 3/00* (2006.01)
  *G01R 1/073* (2006.01)

(52) U.S. Cl.
  CPC ..... *G01R 1/06722* (2013.01); *G01R 1/06738* (2013.01); *G01R 1/0735* (2013.01); *G01R 3/00* (2013.01)

(58) Field of Classification Search
  CPC ............ G01R 1/06722; G01R 1/06738; G01R 1/0735; G01R 3/00
  See application file for complete search history.

(56) References Cited

U.S. PATENT DOCUMENTS

| | | |
|---|---|---|
| 4,027,935 A | 6/1977 | Byrnes et al. |
| 4,116,523 A | 9/1978 | Coberly et al. |
| 4,737,114 A | 4/1988 | Yaegashi |
| 4,773,877 A | 9/1988 | Kruger et al. |
| 4,821,411 A | 4/1989 | Yaegashi |
| 4,952,272 A | 8/1990 | Okino et al. |
| 5,177,438 A | 1/1993 | Littlebury et al. |
| 5,190,637 A | 3/1993 | Guckel |
| 5,286,208 A | 2/1994 | Matsuoka |
| 5,321,685 A | 6/1994 | Nose et al. |
| 5,476,211 A | 12/1995 | Khandros |

(Continued)

FOREIGN PATENT DOCUMENTS

| | | |
|---|---|---|
| JP | 4014040 A2 | 1/1992 |
| JP | 2734412 B2 | 3/1998 |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

(Continued)

*Primary Examiner* — Lee E Rodak
(74) *Attorney, Agent, or Firm* — Holland & Hart LLP

(57) ABSTRACT

Embodiments are directed to probe structures, arrays, methods of using probes and arrays, and/or methods for making probes and/or arrays wherein the probes include at least one flat tensional spring segment.

15 Claims, 21 Drawing Sheets

(56) References Cited

U.S. PATENT DOCUMENTS

| | | |
|---|---|---|
| 5,513,430 A | 5/1996 | Yanof et al. |
| 5,599,194 A | 2/1997 | Ozawa et al. |
| 5,605,614 A | 2/1997 | Bornand |
| 5,811,982 A | 9/1998 | Beaman et al. |
| 5,865,641 A | 2/1999 | Swart et al. |
| 5,892,223 A | 4/1999 | Karpov et al. |
| 5,917,707 A | 6/1999 | Khandros et al. |
| 5,952,843 A | 9/1999 | Vinh |
| 5,994,152 A | 11/1999 | Khandros et al. |
| 6,027,630 A | 2/2000 | Cohen |
| 6,043,563 A | 3/2000 | Eldridge et al. |
| 6,184,053 B1 | 2/2001 | Eldridge et al. |
| 6,208,155 B1 | 3/2001 | Barabi et al. |
| 6,218,203 B1 | 4/2001 | Khoury et al. |
| 6,250,933 B1 | 6/2001 | Khoury et al. |
| 6,255,126 B1 | 7/2001 | Mathieu et al. |
| 6,264,477 B1 | 7/2001 | Smith et al. |
| 6,268,015 B1 | 7/2001 | Mathieu et al. |
| 6,299,458 B1 | 10/2001 | Yamagami et al. |
| 6,329,827 B1 | 12/2001 | Beaman et al. |
| 6,336,269 B1 | 1/2002 | Eldridge et al. |
| 6,358,097 B1 | 3/2002 | Peters |
| 6,414,501 B2 | 7/2002 | Kim et al. |
| 6,426,638 B1 | 7/2002 | Di Stefano |
| 6,482,013 B2 | 11/2002 | Eldridge et al. |
| 6,491,968 B1 | 12/2002 | Mathieu et al. |
| 6,507,207 B2 | 1/2003 | Nguyen |
| 6,520,778 B1 | 2/2003 | Eldridge et al. |
| 6,560,861 B2 | 5/2003 | Fork et al. |
| 6,573,738 B1 | 6/2003 | Matsuo et al. |
| 6,624,645 B2 | 9/2003 | Haseyama et al. |
| 6,626,708 B2 | 9/2003 | Phillips |
| 6,651,325 B2 | 11/2003 | Lee et al. |
| 6,672,876 B1 | 1/2004 | Takekoshi |
| 6,690,185 B1 | 2/2004 | Khandros et al. |
| 6,720,781 B2 | 4/2004 | Ott et al. |
| 6,758,682 B1 | 7/2004 | Kosmala |
| 6,771,084 B2 | 8/2004 | Di Stefano |
| 6,777,319 B2 | 8/2004 | Grube et al. |
| 6,783,405 B1 | 8/2004 | Yen |
| 6,784,378 B2 | 8/2004 | Zhu et al. |
| 6,787,456 B1 | 9/2004 | Kripesh et al. |
| 6,807,734 B2 | 10/2004 | Eldridge et al. |
| 6,811,406 B2 | 11/2004 | Grube |
| 6,844,748 B2 | 1/2005 | Sato et al. |
| 6,855,010 B1 | 2/2005 | Yen |
| D507,198 S | 7/2005 | Kister |
| 6,935,901 B2 | 8/2005 | Simpson et al. |
| 6,967,492 B2 | 11/2005 | Tsui et al. |
| 6,998,857 B2 | 2/2006 | Terada et al. |
| 7,047,638 B2 | 5/2006 | Eldridge et al. |
| 7,063,541 B2 | 6/2006 | Grube et al. |
| 7,091,729 B2 | 8/2006 | Kister |
| 7,098,540 B1 | 8/2006 | Mohan et al. |
| 7,109,118 B2 | 9/2006 | Cohen et al. |
| 7,126,220 B2 | 10/2006 | Lahiri et al. |
| 7,131,848 B2 | 11/2006 | Lindsey et al. |
| 7,148,709 B2 | 12/2006 | Kister |
| 7,172,431 B2 | 2/2007 | Beaman et al. |
| 7,198,704 B2 | 4/2007 | Cohen et al. |
| 7,220,134 B2 | 5/2007 | Goodman et al. |
| 7,229,542 B2 | 6/2007 | Bang |
| 7,235,166 B2 | 6/2007 | Cohen et al. |
| 7,239,219 B2 | 7/2007 | Brown et al. |
| 7,252,861 B2 | 8/2007 | Smalley |
| 7,256,593 B2 * | 8/2007 | Treibergs ............. G01R 1/0466 324/763.01 |
| 7,265,565 B2 | 9/2007 | Chen et al. |
| 7,273,812 B2 | 9/2007 | Kim et al. |
| 7,279,917 B2 | 10/2007 | Williams et al. |
| 7,288,178 B2 | 10/2007 | Cohen et al. |
| 7,291,254 B2 | 11/2007 | Cohen et al. |
| 7,326,327 B2 | 2/2008 | Armstrong et al. |
| 7,368,044 B2 | 5/2008 | Cohen et al. |
| 7,412,767 B2 | 8/2008 | Kim et al. |
| 7,435,102 B2 | 10/2008 | Goodman |
| 7,436,192 B2 | 10/2008 | Kister |
| 7,437,813 B2 | 10/2008 | Tunaboylu et al. |
| 7,446,548 B2 | 11/2008 | Chen |
| 7,449,910 B2 | 11/2008 | Kirby et al. |
| 7,456,642 B2 | 11/2008 | Saulnier et al. |
| 7,462,800 B2 | 12/2008 | Tunaboylu et al. |
| 7,498,714 B2 | 3/2009 | Lockard et al. |
| 7,501,328 B2 | 3/2009 | Lockard et al. |
| 7,504,839 B2 | 3/2009 | Feigenbaum et al. |
| 7,504,840 B2 | 3/2009 | Arat et al. |
| 7,527,721 B2 | 5/2009 | Lembrikov et al. |
| 7,531,077 B2 | 5/2009 | Cohen et al. |
| 7,533,462 B2 | 5/2009 | Gleason et al. |
| 7,557,595 B2 | 7/2009 | Chen et al. |
| 7,579,856 B2 | 8/2009 | Khandros et al. |
| 7,583,098 B2 | 9/2009 | Tunaboylu et al. |
| 7,628,620 B2 | 12/2009 | Gritters |
| 7,629,807 B2 | 12/2009 | Hirakawa et al. |
| 7,637,007 B2 | 12/2009 | Tunaboylu et al. |
| 7,638,028 B2 | 12/2009 | Tunaboylu et al. |
| 7,640,651 B2 | 1/2010 | Cohen et al. |
| 7,674,112 B2 | 3/2010 | Gritters et al. |
| 7,690,925 B2 | 4/2010 | Goodman |
| 7,721,430 B2 | 5/2010 | Chartarifsky et al. |
| 7,731,546 B2 | 6/2010 | Grube et al. |
| 7,733,101 B2 | 6/2010 | Kister |
| 7,798,822 B2 | 9/2010 | Eldridge et al. |
| 7,808,261 B2 | 10/2010 | Kimoto |
| 7,841,863 B2 | 11/2010 | Mathieu et al. |
| 7,850,460 B2 | 12/2010 | Weiland et al. |
| 7,851,794 B2 | 12/2010 | Hobbs |
| 7,888,958 B2 | 2/2011 | Souma et al. |
| 7,922,544 B2 | 4/2011 | Chung |
| 7,928,751 B2 | 4/2011 | Hsu |
| 7,956,288 B2 | 6/2011 | Kazama et al. |
| 8,012,331 B2 | 9/2011 | Lee et al. |
| 8,070,931 B1 | 12/2011 | Cohen et al. |
| 8,111,080 B2 | 2/2012 | Kister |
| 8,299,394 B2 | 10/2012 | Theppakuttai et al. |
| 8,415,963 B2 | 4/2013 | Kister |
| 8,427,186 B2 | 4/2013 | McFarland |
| 8,451,017 B2 | 5/2013 | Gleason et al. |
| 8,613,846 B2 | 12/2013 | Wu et al. |
| 8,717,054 B2 | 5/2014 | Chen et al. |
| 8,717,055 B2 | 5/2014 | Chen et al. |
| 8,723,543 B2 | 5/2014 | Chen et al. |
| 8,729,916 B2 | 5/2014 | Chen et al. |
| 8,742,272 B2 | 6/2014 | English et al. |
| 8,926,379 B2 | 1/2015 | Vinther |
| 9,030,222 B2 | 5/2015 | Eldridge et al. |
| 9,052,342 B2 | 6/2015 | Fan et al. |
| 9,097,740 B2 | 8/2015 | Kister |
| 9,121,868 B2 | 9/2015 | Kister |
| 9,244,101 B2 | 1/2016 | Cohen et al. |
| 9,316,670 B2 | 4/2016 | Kister |
| 9,476,911 B2 | 10/2016 | Kister |
| RE46,221 E | 11/2016 | Kister |
| 9,540,233 B2 | 1/2017 | Kumar et al. |
| 9,671,429 B2 | 6/2017 | Wu et al. |
| 9,702,904 B2 | 7/2017 | Breinlinger et al. |
| 9,878,401 B1 | 1/2018 | Veeramani et al. |
| 9,972,933 B2 | 5/2018 | Kimura et al. |
| 10,215,775 B2 | 2/2019 | Wu et al. |
| 10,416,192 B2 | 9/2019 | Chen et al. |
| 10,641,792 B2 | 5/2020 | Wu et al. |
| 10,788,512 B2 | 9/2020 | Chen et al. |
| 10,877,067 B2 | 12/2020 | Chen et al. |
| 11,131,690 B2 | 9/2021 | Crippa |
| 11,262,383 B1 | 3/2022 | Smalley |
| 2002/0196038 A1 | 12/2002 | Okuno et al. |
| 2003/0001606 A1 | 1/2003 | Bende et al. |
| 2003/0221968 A1 | 12/2003 | Cohen et al. |
| 2004/0000489 A1 | 1/2004 | Zhang et al. |
| 2004/0004001 A1 | 1/2004 | Cohen et al. |
| 2004/0051541 A1 | 3/2004 | Zhou et al. |
| 2004/0065550 A1 | 4/2004 | Zhang |
| 2004/0065555 A1 | 4/2004 | Zhang |
| 2004/0134772 A1 | 7/2004 | Cohen et al. |

(56) References Cited

U.S. PATENT DOCUMENTS

| | | |
|---|---|---|
| 2004/0146650 A1 | 7/2004 | Lockard et al. |
| 2005/0029109 A1 | 2/2005 | Zhang et al. |
| 2005/0032375 A1 | 2/2005 | Lockard et al. |
| 2005/0067292 A1 | 3/2005 | Thompson et al. |
| 2005/0070170 A1 | 3/2005 | Zhang et al. |
| 2005/0072681 A1 | 4/2005 | Cohen et al. |
| 2005/0104609 A1 | 5/2005 | Arat et al. |
| 2005/0176285 A1 | 8/2005 | Chen et al. |
| 2005/0179458 A1 | 8/2005 | Chen et al. |
| 2005/0184748 A1 | 8/2005 | Chen et al. |
| 2005/0189958 A1 | 9/2005 | Chen et al. |
| 2005/0202667 A1 | 9/2005 | Cohen et al. |
| 2005/0230261 A1 | 10/2005 | Cohen et al. |
| 2005/0253606 A1 | 11/2005 | Kim et al. |
| 2006/0006888 A1 | 1/2006 | Kruglick et al. |
| 2006/0051948 A1 | 3/2006 | Kim et al. |
| 2006/0053625 A1 | 3/2006 | Kim et al. |
| 2006/0108678 A1 | 5/2006 | Kumar et al. |
| 2006/0170440 A1 | 8/2006 | Sudin |
| 2006/0226015 A1 | 10/2006 | Smalley et al. |
| 2006/0238209 A1 | 10/2006 | Chen et al. |
| 2007/0144841 A1 | 6/2007 | Chong et al. |
| 2007/0200576 A1 | 8/2007 | Laurent et al. |
| 2008/0108221 A1 | 5/2008 | Kim et al. |
| 2008/0111573 A1 | 5/2008 | Chen et al. |
| 2008/0174332 A1 | 7/2008 | Arat et al. |
| 2009/0066351 A1 | 3/2009 | Arat et al. |
| 2009/0079455 A1 | 3/2009 | Gritters |
| 2010/0088888 A1 | 4/2010 | Mathieu et al. |
| 2010/0134131 A1 | 6/2010 | Chen et al. |
| 2010/0155253 A1 | 6/2010 | Kim et al. |
| 2010/0176834 A1 | 7/2010 | Chen et al. |
| 2011/0147223 A1 | 6/2011 | Kumar et al. |
| 2011/0187397 A1 | 8/2011 | Chen et al. |
| 2011/0187398 A1 | 8/2011 | Chen et al. |
| 2012/0176122 A1 | 7/2012 | Hirata et al. |
| 2014/0065893 A1* | 3/2014 | Vinther .................. H01R 4/48 439/817 |
| 2014/0231264 A1 | 8/2014 | Chen et al. |
| 2019/0204354 A1 | 7/2019 | Chen et al. |
| 2020/0064373 A1* | 2/2020 | Treibergs ........... G01R 1/06722 |
| 2020/0241042 A1 | 7/2020 | Jeong et al. |

FOREIGN PATENT DOCUMENTS

| | | |
|---|---|---|
| JP | 2001337110 A | 12/2001 |
| JP | 2004156993 A | 6/2004 |
| JP | 2004340617 A | 12/2004 |
| JP | 2004340654 A | 12/2004 |
| JP | 2008032400 A | 2/2008 |
| WO | 07097559 A1 | 8/2007 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Hill, Dr. Steve, "An E-FAB Way for Making the Micro World", Materials World is the journal of The Institute of Materials, Sep. 1999, vol. 7, No. 9, pp. 538-539.

Madden, John D. et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Weeden, Otto, Keithley Instruments, Inc. "Probe Card Tutorial", pp. 1-40.

\* cited by examiner

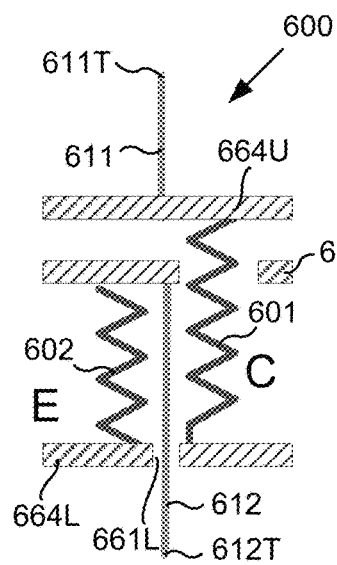 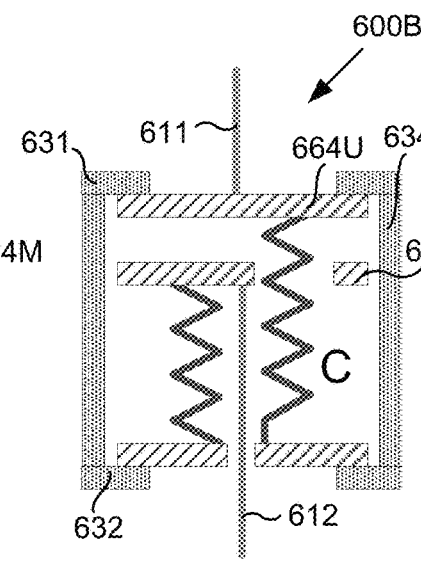 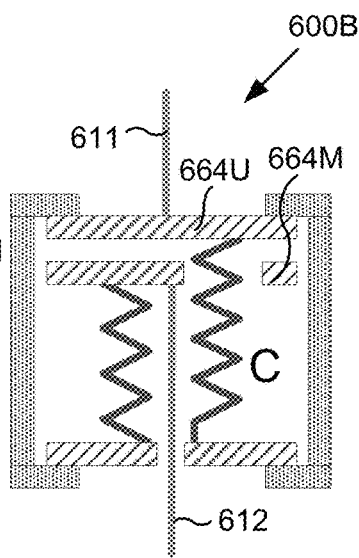
FIG. 6A    FIG. 6B-1    FIG. 6B-2
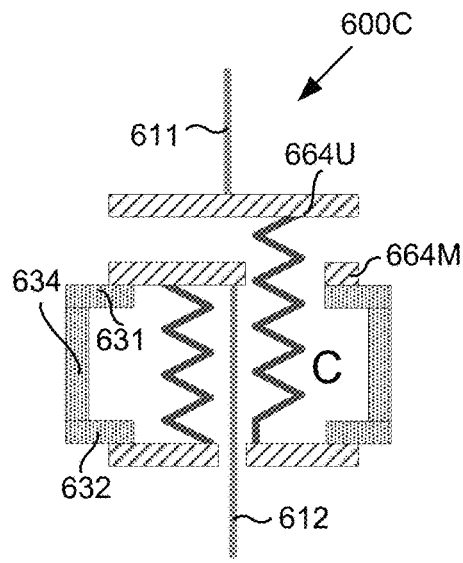 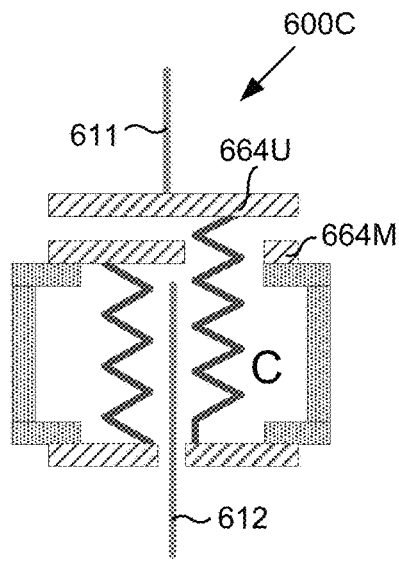
FIG. 6C-1    FIG. 6C-2

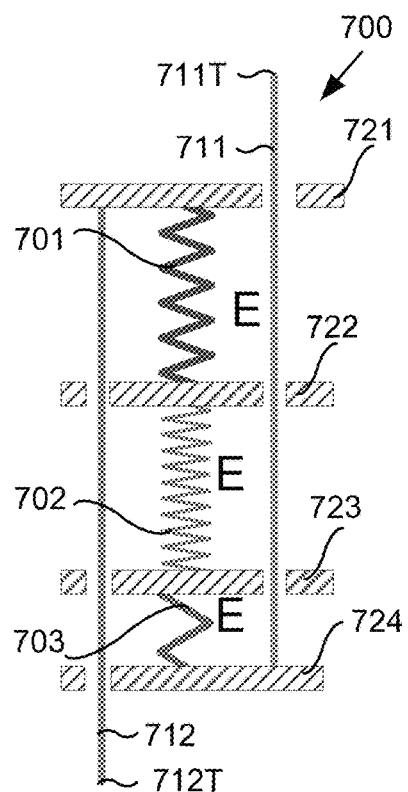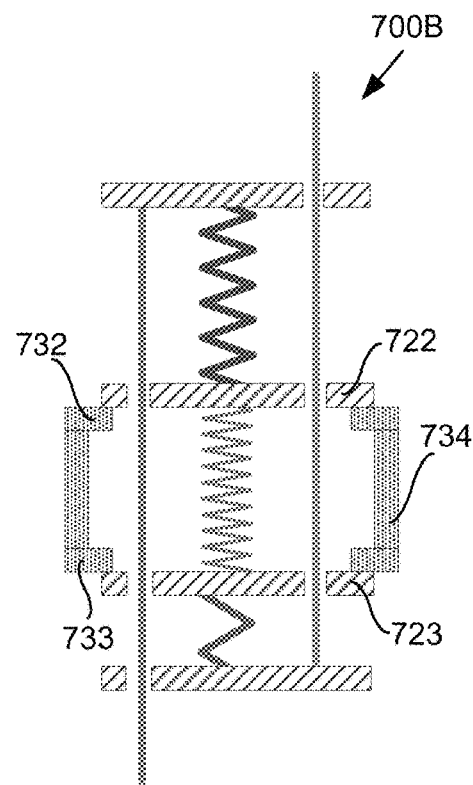
FIG. 7A
FIG. 7B
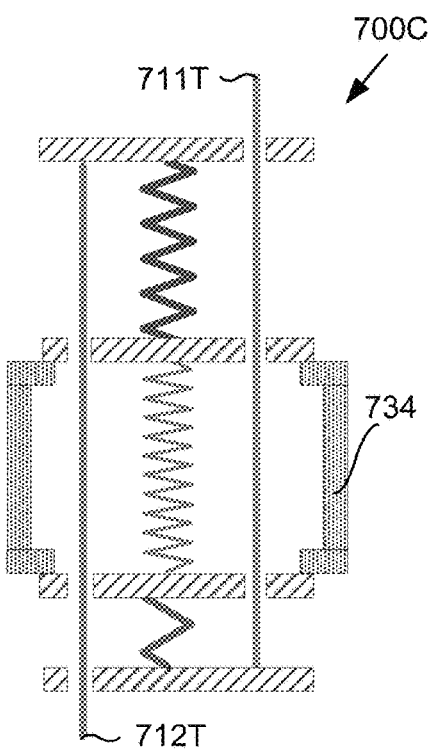
FIG. 7C

Shift lower plates left - right.

Move Upper Plates & Stand Offs into vertical position.

Press Biasing Plate & Base together, stretching the Upper Spring.

Shift Upper Plates.

Remove Biasing Plates.

Remove Base.

COMPLIANT PIN PROBES WITH FLAT EXTENSION SPRINGS, METHODS FOR MAKING, AND METHODS FOR USING

RELATED APPLICATIONS

The below table sets forth the priority claims for the instant application along with filing dates, patent numbers, and issue dates as appropriate. Each of the listed applications is incorporated herein by reference as if set forth in full herein including any appendices attached thereto.

| App. No. | Continuity Type | App. No. | Which was Filed | Which is now | Which issued on | Dkt No. Fragment |
|---|---|---|---|---|---|---|
| This application | is a CNT of | 17/139,940 | 2020 Dec. 31 | pending | — | 401-A |
| 17/139,940 | claims benefit of | 62/956,122 | 2019 Dec. 31 | expired | — | 383-A |
| 17/139,940 | claims benefit of | 62/961,678 | 2020 Jan. 15 | expired | — | 383-B |
| 17/139,940 | claims benefit of | 62/956,124 | 2019 Dec. 31 | expired | — | 382-A |
| 17/139,940 | claims benefit of | 62/961,675 | 2020 Jan. 15 | expired | — | 382-B |
| 17/139,940 | claims benefit of | 62/961,672 | 2020 Jan. 15 | expired | — | 381-B |
| 17/139,940 | claims benefit of | 62/956,016 | 2019 Dec. 31 | expired | — | 381-A |

FIELD OF THE INVENTION

Embodiments of the present invention relate to probes for testing electronic circuits and more particularly to probes with flat extension springs or segments and structures for stabilizing probe operation while still others are directed to methods for making probes for testing electronic circuits.

BACKGROUND OF THE INVENTION

Probes:

Numerous electrical contact probe and pin configurations have been commercially used or proposed, some of which may qualify as prior art and others of which do not qualify as prior art. Examples of such pins, probes, and methods of making are set forth in the following patent applications, publications of applications, and patents. Each of these applications, publications, and patents is incorporated herein by reference as if set forth in full herein as are any teachings set forth in each of their prior priority applications.

| U.S. Pat. App No., Filing Date U.S. App Pub No., Pub Date U.S. Pat. No., Pub Date | First Named Inventor, "Title" | Dkt No. Fragment |
|---|---|---|
| 10/772,943 - Feb. 4, 2004 2005-0104609 - May 19, 2005 | Arat, et al., "Electrochemically Fabricated Microprobes" | 097-A |
| 10/949,738 - Sep. 24, 2019 2006-0006888 - Jan. 12, 2006 | Kruglick, et al., "Electrochemically Fabricated Microprobes" | 119-A |
| 11/028,945 - Jan. 3, 2005 2005-0223543 - Oct. 13, 2005 7,640,651 - Jan. 5, 2010 | Cohen, et al., "A Fabrication Process for Co-Fabricating a Multilayer Probe Array and a Space Transformer | 134-A |
| 11/028,960 - Jan 3, 2005 2005-0179458 - Aug. 18, 2005 7,265,565 - Sep. 4, 2007 | Chen, et al. "Cantilever Microprobes for Contacting Electronic Components and Methods for Making Such Probes | 140-A |
| 11/029,180 - Jan. 3, 2005 2005-0184748 - Aug. 25, 2005 — | Chen, et al. "Pin-Type Probes for Contacting Electronic Circuits and Methods for Making Such Probes" | 139-A |
| 11/029,217 - Jan. 3, 2005 2005-0221644 - Oct. 6, 2005 7,412,767 - Aug. 19, 2008 | Kim, et al., "Microprobe Tips and Methods for Making" | 122-A |
| 11/173,241 - Jun. 30, 2005 2006-0108678 - May 25, 2006 | Kumar, et al., Probe Arrays and Method for Making | 137-A |
| 11/178,145 - Jul. 7, 2005 2006-0112550 - Jun. 1, 2006 7,273,812 - Sep. 25, 2007 | Kim, et al., "Microprobe Tips and Methods for Making" | 136-B |
| 11/325,404 - Jan. 3, 2006 2006-0238209 - Oct. 26, 2006 | Chen, et al., "Electrochemically Fabricated Microprobes" | 153-A |

-continued

| U.S. Pat. App No., Filing Date<br>U.S. App Pub No., Pub Date<br>U.S. Pat. No., Pub Date | First Named Inventor, "Title" | Dkt No.<br>Fragment |
|---|---|---|
| 14/986,500 - Dec. 31, 2015<br>2016-0231356 - Aug. 11, 2016<br>10,215,775 - Feb. 26, 2019 | Wu, et al. "Multi-Layer, Multi-Material Micro-Scale and Millimeter-Scale Devices with Enhanced Electrical and/or Mechanical Properties" | 296-D |
| 16/172,354 - Oct. 18, 2018<br>2019-0204354 - Jul. 4, 2019<br>— | Chen, et al. "Pin-Type Probes for Contacting Electronic Circuits and Methods for Making Such Probes" | 366-A |
| 16/584,818 - Sep. 26, 2019<br>—<br>— | Smalley, "Probes Having Improved Mechanical and/or Electrical Properties for Making Contact between Electronic Circuit Elements and Methods for Making" | 376-A |
| 16/584,863 - Sep. 26, 2019<br>—<br>— | Frodis, "Probes Having Improved Mechanical and/or Electrical Properties for Making Contact between Electronic Circuit Elements and Methods for Making" | 377-A |
| 62/805,589 - Feb. 14, 2019 | Frodis, "Multi-Beam Vertical Probes with Independent Arms Formed of a High Conductivity Metal for Enhancing Current Carrying Capacity and Methods for Making Such Probes" | 370-A |
| 62/955,781 - Dec. 31, 2019 | Veeramani, "Probes with Planar Unbiased Spring Elements for Electronic Component Contact and Methods for Making Such Probes" | 379-A |
| 62/985,859 - Mar. 5, 2020 | Veeramani, "Probes with Planar Unbiased Spring Elements for Electronic Component Contact and Methods for Making Such Probes" | 379-B |
| 17/139,925 - Dec. 31, 2020 | Veeramani, "Probes with Planar Unbiased Spring Elements for Electronic Component Contact and Methods for Making Such Probes" | 398-A |
| 17/139,933 - Dec. 31, 2020 | Wu, "Compliant Pin Probes with Multiple Spring Segments and Compression Spring Deflection Stabilization Structures, Methods for Making, and Methods for Using" | 399-A |
| 17/139,936 - Dec. 31, 2020 | Wu, "Probes with Multiple Springs, Methods for Making, and Methods for Using" | 400-A |

Electrochemical Fabrication:

Electrochemical fabrication techniques for forming three-dimensional structures from a plurality of adhered layers have been, and are being, commercially pursued by Microfabrica® Inc. (formerly MEMGen Corporation) of Van Nuys, California under the process names EFAB and MICA FREEFORM®.

Various electrochemical fabrication techniques were described in U.S. Pat. No. 6,027,630, issued on Feb. 22, 2000 to Adam Cohen.

A related method for forming microstructures using electrochemical fabrication techniques is taught in U.S. Pat. No. 5,190,637 to Henry Guckel, entitled "Formation of Microstructures by Multiple Level Deep X-ray Lithography with Sacrificial Metal Layers".

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this capability, and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, improved operational capabilities, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide improved compliant pin probes with one or more substantially planar spring segments with at least one of the segments being operated in tension with the probes further including sheaths or other rails, slots, channels, spring connector arms, and/or other engagement structures providing enhanced stability of probe performance.

It is an object of some embodiments of the invention to provide a probe including a plurality of spring segments, with at least one being a tensional or extension spring and with the combinations of segments being connected in series and/or in parallel.

It is an object of some embodiments of the invention to provide a probe including multiple spring segments with at least two of the spring segments being spaced from one another but at least partially overlaying one another with a side-to-side or face-to-face orientation.

It is an object of some embodiments of the invention to provide improved probe arrays.

It is an object of some embodiments of the invention to provide methods for making improved probes.

It is an object of some embodiments of the invention to provide a probe having at least one movable contact tip with another end of the probe having a structure that is to be bonded or attached to an electrical interface.

It is an object of some embodiments of the invention to provide a probe with a sheath that has at least one end cap that restrains excessive longitudinal movement of at least one tip from that end of the probe.

It is an object of some embodiments of the invention to provide a probe that has at least two movable contact tips for contacting different electronic components or different pads or bumps on the same electronic component.

It is an object of some embodiments of the invention to provide a probe with the sheath having at least two end caps that restrain excessive longitudinal movement of the tips from either end of the probe.

It is an object of some embodiments of the invention to provide a probe that is configured to provide shunting of a majority of the current through a sheath as opposed to through a majority of the length of the spring elements.

It is an object of some embodiments of the invention to provide a probe with a configuration that provides a compliant element attached to the sheath that is in direct or indirect sliding contact with the moving tip.

It is an object of some embodiments of the invention to provide a probe with a configuration that provides a compliant element attached directly or indirectly to the moving tip and is in direct or indirect sliding contact with a sheath.

It is an object of some embodiments of the invention to provide a method of forming a probe, or a plurality of probes simultaneously, with at least a portion of each of the plurality of spring segments of a probe formed within an opening in a sheath.

It is an object of some embodiments of the invention to provide a method of forming a probe, or a plurality of probes simultaneously, with all of the plurality of spring segments of a probe formed within an opening in a sheath.

It is an object of some embodiments of the invention to provide a probe with a sheath that is formed as multiple components, with the components pushed longitudinally together after formation to load the spring segments and to join the multiple components.

It is an object of some embodiments of the invention to provide a probe with a joining structure or structures that are configured to allow the moving of a compliant element through an engagement feature that inhibits unjoining.

It is an object of some embodiments of the invention to provide a probe with at least some spring segments that undergo tensional loading when transitioning from a build configuration to a working configuration.

It is an object of some embodiments of the invention to provide transitioning that includes moving a compliant element through an engagement feature that inhibits movement back to a build configuration.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively they may address some other object ascertained from the teachings herein. It is not intended that any particular object, let alone all objects, be addressed by any single aspect of the invention.

In a first aspect of the invention, a probe for testing a DUT, includes: (a) a first tip for making electrical contact to an electrical circuit element, the first tip having a contact region and an attachment region; (b) a first extension arm connecting directly or indirectly to the attachment region of the first tip; (c) a compliant structure including at least one spring segment, wherein a first region of the compliant structure joins the first extension arm; (d) a second extension arm joining a second region of the compliant structure such that relative displacement of the first and second extension arms results in elastic movement of the at least one spring segment of the compliant structure; (e) a second tip having an attachment region and a contact region wherein the attachment region joins the second extension arm; and (f) a guidance structure that limits elastic movement of the compliant structure to substantially longitudinal movement along a longitudinal axis of the probe, wherein the at least one spring segment operates under tension to provide an elastic restoration force.

Numerous variations of the first aspect of the invention are possible and include, for example: (1) the at least one spring segment including a plurality of spring segments; (2) the at least one spring segment including a plurality of spring segments with at least one of the plurality of spring segments operating under compression to provide a restoring force; (3) the probe further including at least two stop structures to allow pre-biasing of at least one of the spring segments; (4) the probe further including at least two movable stop structures to allow pre-biasing of at least one of the spring segments; (5) the probe additionally including features that can engage with features on an array structure to allow for pre-biasing of at least one spring segment; (6) the probe additionally including at least one shunting element that directs current from one of the first or second extension arms through a non-compliant structure and then through the other of the first or second extension arms; (7) the sixth variation wherein the at least one shunting structure is a surface against which the extension arms slide; (8) the at least one spring segment includes a metal and is provided in a flat spring configuration; (9) the at least one spring segment includes at least two spring segments that are joined together in a serial configuration; (10) the ninth variation with the at least two joined spring segments operating in tension; (11) the ninth variation with at least one of the at least two joined segments operating in tension while another of the at least two joined segments operates in compression; (12) the ninth variation with the at least two spring segments being flat spring segments and being spaced from one another but at least partially overlay one another in a face-to-face configuration; (13) the ninth variation with the at least two spring segments being flat springs and being separated from one another by an intermediate surface against which at least one of the spring segments can slide; and (14) the probe including a sheath in which at least a portion of the at least one segment of the compliant structure moves. Many further variations are possible and will be understood by those of skill in the art upon reviewing the teachings herein.

In a second aspect of the invention, a probe for testing a DUT, includes: (a) a first tip for making electrical contact to an electrical circuit element, the first tip having a contact region and an attachment region; (b) a first extension arm connecting directly or indirectly to the attachment region of the first tip; (c) a compliant structure including at least one spring segment, wherein a first region of the compliant structure joins the first extension arm; (d) a second extension arm joining a second region of the compliant structure such that relative displacement of the first and second extension arms results in elastic movement of the at least one spring segment of the compliant structure; (e) a second tip having a first attachment region and a second attachment region wherein the first attachment region of the second tip joins the second extension arm; and (f) a guidance structure that limits elastic movement of the compliant structure to substantially longitudinal movement along a longitudinal axis of the probe, wherein the at least one spring segment operates under tension to provide an elastic restoration force, and wherein the second attachment region of the second tip is configured for attachment to a location on a second circuit element to which the probe is to be joined.

Numerous variations of the second aspect of the invention are possible and include, for example, those noted with regard to the first aspect.

In a third aspect of the invention, a probe for testing a DUT, includes: (a) a first tip for making electrical contact to an electrical circuit element, the first tip having a contact region and an attachment region; (b) a first extension arm connecting directly or indirectly to the attachment region of the first tip; (c) a compliant structure including at least one spring segment, wherein a first region of the compliant structure joins the first extension arm; (d) a second extension arm joining a second region of the compliant structure such that relative displacement of the first and second extension arms results in elastic movement of the at least one spring segment of the compliant structure; (e) a second tip having a first attachment region and a second region wherein the first attachment region of the second tip joins the second extension arm; and (f) a guidance structure that limits elastic movement of the compliant structure to substantially longitudinal movement along a longitudinal axis of the probe, wherein the at least one spring segment operates under tension to provide an elastic restoration force, and wherein the second region of the second tip is configured for making an electrical connection to a second circuit element, wherein the configuration is selected from the group consisting of: (1) a tip for making a contact connection, and (2) a tip for making an attached connection.

Numerous variations of the third aspect of the invention are possible and include, for example, those noted with regard to the first aspect.

In a fourth aspect of the invention, a probe for testing a DUT, includes: (a) a first tip for making electrical contact to an electrical circuit element, the first tip having a first contact region and a first connection region; (b) a first extension arm connecting directly or indirectly to the first connection region of the first tip; (c) a compliant structure including at least one first spring segment, and wherein a first region of the compliant structure connects directly or indirectly to the first extension arm; (d) a second extension arm connecting directly or indirectly to a second connection region of the compliant structure such that relative displacement of the first extension arm and the second extension arm results in elastic movement of the at least one first spring segment of the compliant structure; (e) a second tip having a first connection region and a second region wherein the first connection region joins the second extension arm; and (f) at least one guidance element that limits relative movement of the first tip and the second tip along a substantially longitudinal axis of the probe, wherein the at least one spring undergoes increased extension upon relative displacement of the first tip and the second tip toward one another along the longitudinal axis of the probe, and wherein the second region of the second tip is configured for making an electrical connection to a second circuit element, wherein the configuration is selected from the group consisting of: (1) a tip for making a contact connection, and (2) a tip for making an attached connection.

Numerous variations of the fourth aspect of the invention are possible and include, for example, those noted with regard to the first aspect, mutatis mutandis.

In a fifth aspect of the invention, a probe for testing a DUT, includes: (a) a first tip for making electrical contact to an electrical circuit element, the first tip having a first contact region and a first connection region; (b) a first extension arm connecting directly or indirectly to the first connection region of the first tip; (c) a compliant structure including at least one first spring segment, and wherein a first region of the compliant structure connects directly or indirectly to the first extension arm; (d) a second extension arm connecting directly or indirectly to a second connection region of the compliant structure such that relative displacement of the first extension arm and the second extension arm results in elastic movement of the at least one first spring segment of the compliant structure; and (e) a second tip having a first connection region and a second region wherein the first connection region joins the second extension arm, wherein the at least one spring undergoes increased extension upon relative displacement of the first tip and the second tip toward one another along the longitudinal axis of the probe, and wherein the second region of the second tip is configured for making an electrical connection to a second circuit element, wherein the configuration is selected from the group consisting of: (1) a tip for making a contact connection, and (2) a tip for making an attached connection.

Numerous variations of the fifth aspect of the invention are possible and include, for example, those noted with regard to the first aspect, mutatis mutandis.

In a sixth aspect of the invention, a probe for testing a DUT, includes: (a) a first tip for making electrical contact to an electrical circuit element, the first tip having a first contact region and a first connection region; (b) a first extension arm connecting directly or indirectly to the first connection region of the first tip; (c) a compliant structure including at least one first spring segment, and wherein a first region of the compliant structure connects directly or indirectly to the first extension arm; (d) a second extension arm connecting directly or indirectly to a second connection region of the compliant structure such that relative displacement of the first extension arm and the second extension arm results in elastic movement of the at least one first spring segment of the compliant structure; (e) a second tip having a first connection region and a second region wherein the first connection region joins the second extension arm; and (f) at least one structure that is directly or indirectly attached to an end of the at least one spring for providing a function selected from the group consisting of: (1) providing a stop structure that moves with the end of the spring as a first tip and second tip are moved relative to one another; and (2) providing for relative longitudinal motion of the first tip relative to the second tip while inhibiting excessive lateral motion of at least one of the first tip or the second tip, wherein the at least one spring undergoes increased extension upon relative displacement of the first tip and the second tip toward one another along the longitudinal axis of the probe, and wherein the second region of the second tip is configured for making an electrical connection to a second circuit element, wherein the configuration is selected from the group consisting of: (1) a tip for making a contact connection, and (2) a tip for making an attached connection.

Numerous variations of the sixth aspect of the invention are possible and include, for example, those noted with regard to the first aspect, mutatis mutandis.

In a seventh aspect of the invention, a probe for testing a DUT, includes: (a) a first tip for making electrical contact to an electrical circuit element, the first tip having a first contact region and a first connection region; (b) a first extension arm connecting directly or indirectly to the first connection region of the first tip; (c) a compliant structure including at least one first spring segment, and wherein a first region of the compliant structure connects directly or indirectly to the first extension arm; (d) a second extension arm connecting directly or indirectly to a second connection region of the compliant structure such that relative displacement of the first extension arm and the second extension arm results in elastic movement of the at least one first spring segment of the compliant structure; (e) a second tip having a first connection region and a second region wherein the first connection region joins the second extension arm; (f) a rigid probe body providing a frame which supports the relative lateral positioning of the compliant structure, the first extension arm, and the second tip extension arm while allowing at least one of the first extension arm and first tip or the second extension arm and second tip to move longitudinally, via an external compressive force applied to the first and/or second tips, through a working range of longitudinally extended probe length to longitudinally compressed probe length while increasing a tensional force on the at least one first spring segment and moving longitudinally through a working range of longitudinally compressed probe length to extended probe length under a force of extension provided, at least in part, by the tensional force stored in the at least one first spring segment, wherein the rigid probe body extends from at least one end of the at least one first spring segment to the other end of the at least one first spring segment at a full working extension of the at least one first spring segment, wherein the at least one spring undergoes increased extension upon relative displacement of the first tip and the second tip toward one another along the longitudinal axis of the probe, and wherein the second region of the second tip is configured for making an electrical connection to a second circuit element, wherein the configuration is selected from the group consisting of: (1) a tip for making a contact connection, and (2) a tip for making an attached connection.

Numerous variations of the seventh aspect of the invention are possible and include, for example, those noted with regard to the first aspect, mutatis mutandis.

In an eighth aspect of the invention, a probe array for testing a DUT, includes: (1) at least one array structure having a plurality of openings defining at least in part lateral positions of a plurality of probes; and (2) a plurality of probes located in the plurality of openings, wherein each of the plurality of probes comprises a probe selected from the group consisting of: (1) Aspect 1, (2) Aspect 2, (3) Aspect 3, (4) Aspect 4, (5) Aspect 5, (6) Aspect 6, and (7) Aspect 7.

Numerous variations of the eighth aspect of the invention are possible and include, for example: variations (1)-(14) noted with regard to the first aspect, mutatis mutandis. Additional variations also include, for example: (15) the at least one array structure being a guide plate; (16) the at least one array structure being a plurality of plates; (17) the probes including fixed flange-like structures for engaging perimeters of the openings; (18) the probes including movable flange-like structures for engaging perimeters of the openings; (19) the probes including lower flange-like structures with upper surfaces which engage at least portions of lower perimeter surfaces of an opening in a lower array structure; (20) the probes including upper flange-like structures with lower surfaces which engage at least portions of upper perimeter surfaces of openings in an upper array structure; (21) the probes including the features of both the fifth and sixth variations; (22) the array structure including a lower biasing assembly and an upper biasing assembly with each biasing assembly including two longitudinally stacked plates with openings that can be laterally slid relative to one another to align openings for loading of probes and can be laterally slid to partially close the openings to allow engagement of at least portions of perimeter edges of at least one of the stacked plates with features on the probes to retain the probes; (23) the eighth variation where the assemblies include at least two plates with slots into which bridging structures extend which hold the plates together in the direction of their normals while allowing lateral sliding to occur along the planes of the plates; (24) the array structure including multiple spaced plates or assemblies along with standoffs that set a longitudinal (or normal direction) spacing of the plates or assemblies; and (25) the twenty-fourth variation wherein the standoffs set a distance between the spaced plates that hold at least one spring segment of each of a plurality of probes in a biased state without the probe tips being compressed toward one another. Still numerous other variations are possible and will be apparent to those skill in the art upon review of the teachings herein.

In a ninth aspect of the invention, a method of forming at least a portion of a plurality of probes using a multi-layer, multi-material fabrication process, includes: (a) forming a plurality of multi-material layers representing at least portions of cross-sections of the plurality of probes, wherein each successive layer formed is formed on and adhered to an immediately preceding layer, with each layer formed from at least two materials with at least one being a structural material and at least one being a sacrificial material, wherein the formation of each such multi-material layer includes: (i) depositing a first of the at least two materials; (ii) depositing a second of the at least two materials; and (b) after the forming of the plurality of successive layers, separating at least a portion of the sacrificial material from the structural material to reveal the three-dimensional structure, wherein the probe includes the probe of any of the first to seventh aspects.

Numerous variations of the ninth aspect of the invention are possible and include, for example, variations (1)-(14) of the first aspect. Additional variations also include, for example: (15) each of the at least one structural material being a metal; (16) at least one structural material including at least two structural materials with at least one of the at least two structural materials being a dielectric; (17) a longitudinal axis of the plurality of probes extending parallel to a build axis during formation of the probes; (18) a longitudinal axis of the plurality of probes extending perpendicular to a build axis during formation of the probes; (19) the portion of the probes formed by the multi-layer, multi-material fabrication process including the compliant structures and which are stacked and combined with the relatively rigid structure after layer fabrication and release has been completed; (20) the portion of the probes formed by the multi-layer, multi-material fabrication process including the entire probes; (21) the portion of the probes formed by the multi-layer, multi-material fabrication process including at least the compliant structures; (22) during the multi-layer, multi-material fabrication process, at least a portion of the layers being planarized after deposition of the materials forming those respective layers; (23) the portion of the probes formed by the multi-layer, multi-material fabrication process being subjected to heat treatment to improve one or more properties of the probes; (24) the portion of the probes formed by the multi-layer, multi-material fabrication process being released as individual separate probes from a build substrate prior to assembly into an array configurations; and (25) the portion of the probes formed by the multi-layer, multi-material fabrication process being formed in groups with a lateral spacing of probes in each group during formation corresponding to a lateral spacing to be used in a probe array wherein the probes are released from a build substrate in groups and the groups are assembled into array configurations. Still other variations are possible and included those noted for the first aspect, mutatis mutandis.

In a tenth aspect of the invention, a method of forming a probe array, includes: (a) providing an array of at least one array structure including a plurality of openings for receiving probes wherein the openings are laterally located in an array pattern; (b) providing a plurality of probes, formed using a multi-layer, multi-material fabrication process, including: (i) forming a plurality of multi-material layers representing at least portions of cross-sections of the plurality of probes, wherein each successive layer formed is formed on and adhered to an immediately preceding layer, with each layer formed from at least two materials with at least one being a structural material and at least one being a sacrificial material, wherein the formation of each such multi-material layer includes: (1) depositing a first of the at least two materials; (2) depositing a second of the at least two materials; and (ii) after the forming of the plurality of successive layers, separating at least a portion of the sacrificial material from the structural material to reveal the three-dimensional structure, wherein the probe includes the probe of any of the first to seventh aspects or any such aspects incorporating one or more of its variations; and (c) loading the probes into the openings in the at least one array plate and securing the probes in position in a fixed or longitudinally movable manner.

Numerous variations of the tenth aspect of the invention are possible and include, for example, those noted with regard to the eighth aspect. Still numerous other variations are possible and will be apparent to those skill in the art upon review of the teachings herein.

In an eleventh aspect of the invention, a method of forming a probe array, includes: (a) providing an array including at least two plate-like structures including a plurality of openings for receiving probes wherein the openings are laterally located in an array pattern; (b) providing a plurality of probes, formed using a multi-layer, multi-material fabrication process, including: (i) forming a plurality of multi-material layers representing at least portions of cross-sections of the plurality of probes, wherein each successive layer formed is formed on and adhered to an immediately preceding layer, with each layer formed from at least two materials with at least one being a structural material and at least one being a sacrificial material, wherein the formation of each such multi-material layer includes: (1) depositing a first of the at least two materials; (2) depositing a second of the at least two materials; and (ii) after the forming of the plurality of successive layers, separating at least a portion of the sacrificial material from the structural material to reveal the three-dimensional structure, wherein the probe includes the probe of any of the first to seventh aspects or any such aspects incorporating one or more of its variations; and (c) loading the probes into the openings in the two plate-like structures and setting a desired longitudinal spacing between the plate-like structures.

Numerous variations of the eleventh aspect of the invention are possible and include, for example, those noted with regard to the eighth aspect. Still numerous other variations are possible and will be apparent to those skill in the art upon review of the teachings herein.

In a twelfth aspect of the invention, a method of forming a probe array, includes: (a) providing array structures including at least first and second plate-like assemblies with each including at least first and second plate-like structures that are held together longitudinally but are capable of lateral sliding relative to one another, the assemblies also including a plurality of openings for receiving probes that extend through the structures of the first and second plate-like assemblies; (b) providing at least one standoff; (c) providing at least one base plate; (d) providing a plurality of probes with each having features set forth in the sixth aspect including at least one tensional spring segment and at least first and second movable stops; (e) laterally positioning the probes with respect to the base; (f) longitudinally moving the probes and the base together such that the probes have first ends that extend into an opening in the base and the first moving stop of the probe engages a surface of base; (g) laterally positioning and longitudinally loading the first plate-like assembly over the base; (h) laterally shifting at least two plate-like structures of the first assembly so as to engage and hold the first movable stop of the probe to the base; (i) laterally positioning the at least one standoff and the second of the plate-like assemblies in line with the probes and thereafter longitudinally bringing the at least one standoff into contact with the first plate-like assembly and the second plate-like assembly in contact with the other end of the at least one standoff; (j) contacting a biasing tool to the probe tips that extend into the base and then longitudinally moving the biasing tool relative to the base to cause further separation of the at least two moving stops so that they are separated by an amount that is equal to or greater than a standoff height of inner most plate-like structures of the plate-like assemblies; (k) while the moving stops are separated, laterally displacing the plate-like structures of the second plate-like assembly so as to inhibit the second movable stop from moving back to a position between the second plate-like assembly and the first plate-like assembly; (l) moving the biasing tool away from the base so that a tension induced return force of the at least one spring segment brings the movable stop into contact with the outer surfaces of each of the two plate-like assemblies, and (m) separating the base on the first plate-like assembly to yield a probe array having a plurality of probes, a pair of plate-like assemblies holding the plurality of probes in a biased state.

Numerous variations of the twelfth aspect of the invention are possible and include, for example, those noted with regard to the other aspects of the invention. Further variations exist and include, for example, both plate-like assemblies and the at least one intermediate standoff being loaded onto the probes at the same time. Still numerous other variations are possible and will be apparent to those skill in the art upon review of the teachings herein.

Still other aspects of the invention will be understood by those of skill in the art upon review of the teachings herein. Other aspects of the invention may involve combinations of the above noted aspects of the invention. These other aspects of the invention may provide various combinations of the aspects presented above as well as provide other configurations, structures, functional relationships, and processes that have not been specifically set forth above but are taught by other specific teachings set forth herein or by the teachings set forth herein as a whole.

BRIEF DESCRIPTION OF THE DRAWINGS

FIG. 4B-1 shows the probe in an undeflected state, while FIG. 4B-2 shows the probe with the lower tip compressed toward the sheath with the spring being biased or stretched as the top movable plate is forced away from the top of the sheath, and while FIG. 4B-3 shows the probe after the upper tip is compressed toward the sheath with the spring being further biased or stretched as the lower movable plate is forced away from the lower portion of the sheath.

FIG. 5A provides a schematic illustration of a probe 500 similar to that of FIG. 2I with two tensional springs 501-1 and 501-2 functionally connected in parallel and with additional structural emphasis added to the three structural member that may function as movable stops.

FIGS. 5B-1 to 5B-2 provide first and second variations of the probe of FIG. 5A but with the addition of sheaths or frame structures that set the minimum distance between a first pair of movable stops (i.e., the lower pair) with the minimum distance of FIG. 5B-1 being the same separation distance shown in FIG. 5A while the minimum distance of FIG. 5B-2 being larger than the separation distance shown in FIG. 5A.

FIGS. 5C-1 to 5C-2 provide third and fourth variations of the probe of FIG. 5A but with the addition of sheaths or frame structures that set the maximum distance between a second pair of movable stops (i.e., the upper pair) with the maximum distance of FIG. 5C-1 being the same separation distance shown in FIG. 5A while the maximum distance of FIG. 5C-2 being smaller than the separation distance shown in FIG. 5A.

FIG. 6A provides a schematic illustration of a probe similar to that of FIG. 2J with a tensional spring and a compression spring functionally connected side by side in series and with additional structural emphasis added to the three structural members that may function as movable stops.

FIGS. 6B-1 to 6B-2 provide first and second variations of the probe of FIG. 6A but with the addition of sheaths or frame structures that set the maximum distance between a first pair of movable stops (i.e., the top and bottom stops) with the maximum distance of FIG. 6B-1 being the same separation distance shown in FIG. 6A while the maximum distance of FIG. 6B-2 being smaller than the separation distance shown in FIG. 6A.

FIGS. 6C-1 to 6C-2 provide third and fourth variations of the probe of FIG. 6A but with the addition of sheaths or frame structures that set a minimum distance between a second pair of movable stops (i.e., the middle and bottom stops) with the minimum distance of FIG. 5C-1 being the same separation distance shown in FIG. 5A while the minimum distance of FIG. 5C-2 being smaller than the separation distance shown in FIG. 5A.

FIGS. 7A-7C provide a three-spring segment example probe with the upper spring, lower spring, and middle spring all operating in tension wherein the probe also includes upper and lower moving stops as well as upper and lower tips and arms with fixed stops also shown in FIGS. 7B and 7C.

FIGS. 11-1 to 11-6 provide a number of isometric views of a probe and views of expanded sections of the probe according to another embodiment of the invention where the probe provides a specific implementation of spring and guide functionality of the probe of FIG. 10.

DETAILED DESCRIPTION OF PREFERRED EMBODIMENTS

Electrochemical Fabrication in General

Figure 1A:
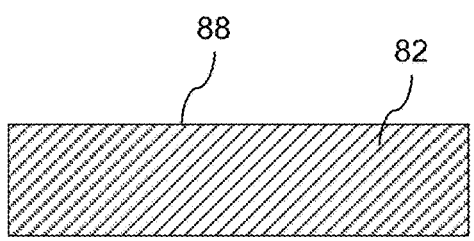
FIGS. 1A-1F schematically depict the formation of a first layer of a structure using adhered mask plating where the blanket deposition of a second material overlays both the openings between deposition locations of a first material and the first material itself.
Figure 1B:
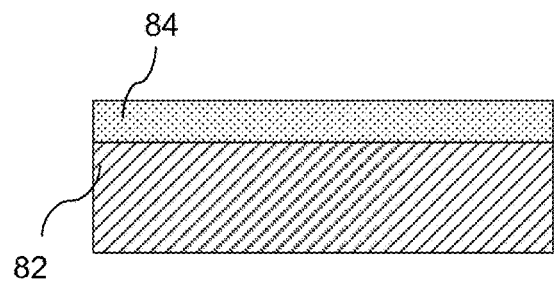
Figure 1C:
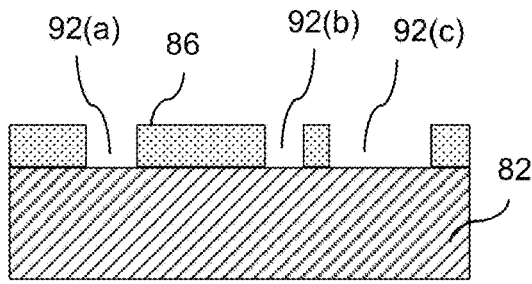
Figure 1D:
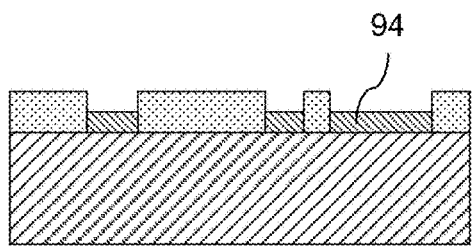
Figure 1E:
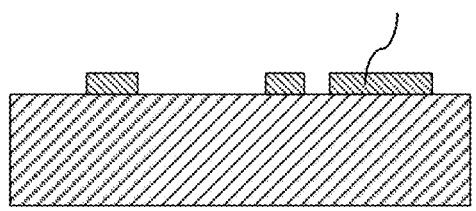
Figure 1F:
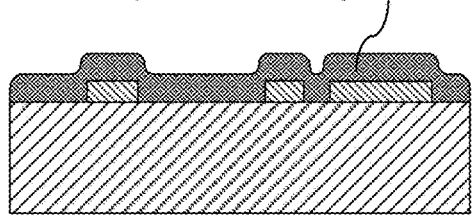
Figure 1G:
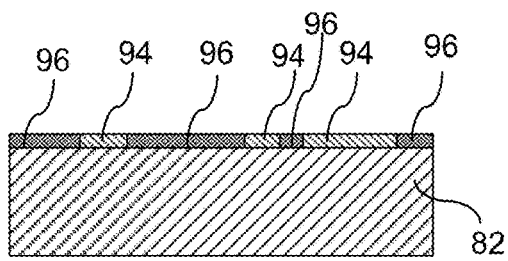
FIG. 1G depicts the completion of formation of the first layer resulting from planarizing the deposited materials to a desired level.
Figure 1H:
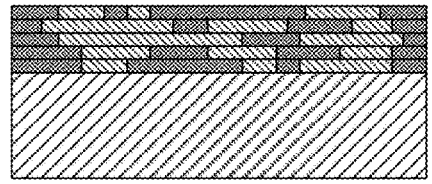
FIGS. 1H and 1I respectively depict the state of the process after formation of the multiple layers of the structure and after release of the structure from the sacrificial material.
Figure 1I:
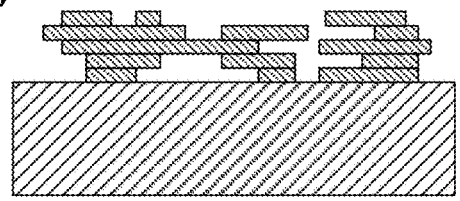

FIGS. 1A-1I illustrate side views of various states in an alternative multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metals form part of the layer. In FIG. 1A, a side view of a substrate 82 having a surface 88 is shown, onto which patternable photoresist 84 is deposited, spread, or cast as shown in FIG. 1B. In FIG. 1C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 1D, a metal 94 (e.g. nickel) is shown as having been electroplated into the openings 92(a)-92(c). In FIG. 1E, the photoresist has been removed (i.e. chemically or otherwise stripped) from the substrate to expose regions of the substrate 82 which are not covered with the first metal 94. In FIG. 1F, a second metal 96 (e.g. silver) is shown as having been blanket electroplated over the entire exposed portions of the substrate 82 (which is conductive) and over the first metal 94 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed as shown in FIG. 1I to yield a desired 3-D structure 98 (e.g. component or device) or multiple such structures.

In some variations, the structure may be separated from the substrate. For example, release of the structure (or multiple structures if formed in a batch process) from the substrate may occur when releasing the structure from the sacrificial material particularly when a layer of sacrificial material is positioned between the first layer of the structure and the substrate. Alternative methods may involve, for example, the use of a dissolvable substrate that may be separated before, during or after removal of the sacrificial material, machining off the substrate before or after removal of the sacrificial material, or use of a different intermediate material that can be dissolved, melted or otherwise used to separate the structure(s) from the substrate before, during, or after removal of the sacrificial material that surround the structure(s).

Various embodiments of various aspects of the invention are directed to formation of three-dimensional structures from materials, some, or all, of which may be electrodeposited or electroless deposited (as illustrated in FIGS. 1A-1I and as discussed in various patents and patent applications incorporated herein by reference). Some of these structures may be formed from a single build level (e.g. a planarized layer) that is formed from one or more deposited materials while others are formed from a plurality of build levels, each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used, while in still other embodiments, layer thickness may be varied during formation of different levels of the same structure. In some embodiments, microscale structures have lateral features positioned with 0.1-10 micron level precision and minimum feature sizes on the order of microns to tens of microns. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions that may extend into the 0.1-50 millimeter range, or larger, and features positioned with a precision in the micron to 100 micron range and with minimum feature sizes on the order of several microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), adhered masks and masking operations (masks and operations that use masks that are adhered to a substrate onto which selective deposition or etching is to occur as opposed to only being contacted to it), and/or selective patterned deposition of materials (e.g. via extrusion, jetting, or controlled electrodeposition) as opposed to masked patterned deposition. Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including: (1) by application of a photoresist, selective exposure of the photoresist, and then development of the photoresist, (2) selective transfer of pre-patterned masking material, and/or (3) direct formation of masks from computer-controlled depositions of material. In some embodiments adhered mask material may be used as a sacrificial for the layer or may be used only as a masking material which is replaced by another material (e.g., dielectric or conductive material prior to completing formation of a layer where the replacement material will be considered the sacrificial material of the respective layer. Masking material may or may not be planarized before or after deposition of material into voids or openings included therein.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration). Such use of selective etching and/or interlaced material deposition in association with multiple layers is described in U.S. patent application Ser. No. 10/434,519, by Smalley, filed May 7, 2003, which is now U.S. Pat. No. 7,252,861, and which is entitled "Methods of and Apparatus for Electrochemically Fabricating Structures Via Interlaced Layers or Via Selective Etching and Filling of Voids". This referenced application is incorporated herein by reference.

Temporary substrates on which structures may be formed may be of the sacrificial-type (i.e. destroyed or damaged during separation of deposited materials to the extent they cannot be reused) or non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g., replanarizing one or more selected surfaces or applying a release layer, and the like) though they may or may not be reused for a variety of reasons.

Definitions of various terms and concepts that may be used in understanding the embodiments of the invention (either for the devices themselves, certain methods for making the devices, or certain methods for using the devices) will be understood by those of skill in the art. Some such terms and concepts are discussed herein while other such terms are addressed in the various patent applications to which the present application claims priority and/or which are incorporated herein by reference (e.g., U.S. patent application Ser. No. 16/584,818).

Probe Embodiments

Probe of the various embodiments of the invention can take on a variety of forms.

Each probe includes at least one substantially flat tensional spring segment that biases a test contact tip relative to a second tip that may or may not be a contact tip wherein the probes generally include structural elements for ensuring stable and robust probe functionality. In some embodiments, the probes further include a plurality of substantially flat spring segments, either of the extension type only or of a combination of one or more extension springs and one or more compression springs. In some embodiments, springs are configured to operate functionally in series or in parallel with the spring segments at least partially lying side-by-side or face-to-face as opposed to edge-to-edge or end-to-end. In some embodiments, probe deformation is limited to a compression along the axis of the probe (e.g., substantially longitudinal compression as probe tips or circuit joining elements move to more proximal positions).

Numerous variations of the probe embodiments are possible; including for example:
 (1) use, or inclusion, of only extension springs;
 (2) use, or inclusion, of a combination of compression springs and extension springs;
 (3) use, or inclusion, of multi-segment springs as a single effective spring;
 (4) use, or inclusion, of multi-segment springs including springs in series with interconnecting bars, plates or the like as necessary;
 (5) use, or inclusion, of multi-segment springs including springs in parallel with interconnecting bars, plates or the like as necessary;
 (6) use, or inclusion, of multi-segment springs formed of springs grouped in a combination of parallel and series connections with interconnecting bars, plates or the like as necessary;
 (7) use, or inclusion, of individual springs having substantially linear behavior (e.g. $F=K*\Delta x$) or having non-linear behaviors;
 (8) use, or inclusion, of individual spring segments having common or different spring constants;
 (9) use, or inclusion, of springs or spring segments that are substantially flat (e.g. having substantially planar front and back surfaces when unbiased or having substantially flat profiles whether formed from a single layer, multiple layers or in some other manner);
 (10) use, or inclusion, of springs or spring segments laying in different parallel but offset planes (e.g., each formed within a single layer or from a series of adjacent layers) with connection elements extending from one spring segment to another through one or more intermediate layers;

(11) use, or inclusion, of individual probes that include a fixed stop, or more than one fixed stop, which interacts with one or more movable stops or alternatively the one or more fixed stop may be part of an array mounting structure or array assembly which can engage the movable stop or stops once probes are loaded into the array structure or final assembly is completed;

(12) use, or inclusion, of individual probes including at least two fixed stops that may be used to bias one or more spring segments such that the one or more spring segments are pre-biased by at least two moving stops being on the inside (spring side) of their respective fixed stops for a spring that is compressed or both being on the outside of their respective stops for a spring that is operated as an extension spring (i.e. biased in an extended state);

(13) use, or inclusion, of individual probes that include three springs, or more, and two or more moving stops that contact fixed stops when their respective springs, if of the extension type, are compressed to a working limit or, if of the compression type, are made to extend to a working limit;

(14) use, or inclusion, of spring segments that are connected via flat, T-shaped, angled, or other bar or plate configurations that run between springs or spring segments on a single layer or via one or more intermediate layers that separate springs or spring segments;

(15) use, or inclusion, of spring segments that are connected via flat, T-shaped, angled, or other bar or plate configurations that run along the edges of the springs or spring segments on a single layer or via one or more layers;

(16) use, or inclusion, of guide elements (e.g. sheaths, rails, fixed or movable plates, slip rings, or the like) in probes with compression springs to ensure that compression springs do not laterally bulge excessively during compression (e.g. where unintended contact or interference with an adjacent spring or spring segment could occur or even unintended contact with a neighboring probe);

(17) use, or inclusion, of probe tips that may take on one or more forms including flat surfaces, knife edge or blade-like structures, multi-contact crown-like configurations, single point contacts, single curved contact structures, or multiple curved contact structures;

(18) use, or inclusion, of tips that include the same material as the springs or that include a material that is different from a spring material,

(19) use, or inclusion, of a probe configuration that allows, during use, current to flow from one probe tip to another probe tip via at least one spring;

(20) use, or inclusion, of tips, tip extensions, springs, connection bars, sheaths, and/or the like providing moving or non-moving (e.g. sliding) contacts between elements of a single probe to shunt a portion, most, or all of the current around spring elements;

(21) use, or inclusion, of incorporated dielectric elements to provide individual probes with isolated conductive regions (e.g. for coaxial or other multi-path probe structures) or to ensure electrical isolation of some probes from other probes;

(22) use, or inclusion, of selective electrical or dielectric connections from probe to guide plates or to other structures to provide desired lateral or longitudinally spacing of probes, alternate current flow paths, and/or to provide electrical shielding;

(23) use, or inclusion, of end regions or intermediate regions of probes that include sliding components or surfaces through which moving probe elements slide as shunting contact surfaces;

(24) use, or inclusion, of end regions or intermediate regions of probes that engage sliding components or surfaces of array or mounting structures against which probe shaft elements slide as shunting contact surfaces;

(25) use, or inclusion, of sliding surfaces of moving probe components or of fixed probe components that include different materials or have regions of different materials as compared to materials used in formation of the bulk of spring segment elements;

(26) use, or inclusion, of probes that are formed using multi-layer, multi-material electrochemical fabrication methods in whole or in part;

(27) use, or inclusion, of probes that are formed as separate components or as partly connected or aligned components that need at least some assembly after formation of components;

(28) use, or inclusion, of probes that are formed in their entirety with all components formed together where build configurations are similar to their working configurations with possible exceptions of additional biasing required prior to use or where such biasing occurs upon initial use;

(29) use, or inclusion, of probes that are formed with all components formed in relation to one another with build configurations that are different from working configurations such that assembly is limited to movement of components from one configuration to another prior to use (e.g., compression or expansion of spring elements, snapping together of separated but aligned component features, sliding together or interlocking components, and the like);

(30) use, or inclusion, of probes that include stop features that do not engage moving stops upon probe formation but instead are made to engage moving stops upon compression or extension of their respective springs, or probe tips, by longitudinal sliding of engagement elements, lateral movement of engagement elements, rotational movement of engagement elements, or the like, where engagement may occur automatically upon initial spring movement, tip movement, or may be made to occur independently of spring or probe tip movement;

(31) use, or inclusion, of probes that include serpentine, saw-tooth, rectangular, triangular, sine-shaped, S-shaped, C-shaped, or numerous other configurations that provide elastic compliance over a working range of probe compression;

(32) use, or inclusion, of probes that are configured for 0.1 or smaller to 0.7 mm or large pitch, or larger (probe-to-probe spacing in an array);

(33) use, or inclusion, of probes that have body diameters or lateral dimensions (e.g., sheath, guide element, or spring width dimensions) ranging from 0.05 mm or less to 0.65 mm or more);

(34) use, or inclusion, of probes that have force targets (at maximum over-travel) from 1 gram or less to 100 grams or more (e.g., 2 g-40 g, 4 g-30 g, 6 g-20 g);

(35) use, or inclusion, of probes that have over-travel targets as low as 50 microns or less or as high as 1 mm or more, (e.g., 200-800 microns or 400-600 microns);

(36) use, or inclusion, of probes that have dimensions that allow pre-loading to occur with a travel of slightly above zero microns to more than 400 microns, (e.g., 20-400 microns, 50-300 microns, or 100-200 microns);

(37) use, or inclusion, of probes that have lengths that may be on the order of 100 microns or less to 5 mm or more (e.g., 0.5 mm to 3 mm);

(38) use, or inclusion, of probes that are formed from layers with their longitudinal axes parallel to a build axis or stacking axes of the layers;

(39) use, or inclusion, of probes that are formed with their longitudinal axes laying in a plane perpendicular to a build axes or stacking axes of layers from which the probes are formed;

(40) use, or inclusion, of probes that are formed with their longitudinal axes laying in a plane perpendicular to a build axes and with a normal to the plane or planes of their spring segments also being perpendicular to the build axes when forming the probes from a plurality of stacked layers;

(41) use, or inclusion, of probes that are formed with their longitudinal axes laying in a plane perpendicular to a build axes and with a normal to the plane or planes of their spring segments being parallel to the build axes when forming the probes from a plurality of stacked layers;

(42) use, or inclusion, of curved lateral cross-sectional features of the probes being approximated by layer-to-layer stair stepping with the approximation dictated by the thickness of individual layers when probes are formed on their sides from a plurality of layers;

(43) use, or inclusion, of spring segments that are constrained upon use by being inside an outer body that forms part of the probes (e.g. sheath or framing structure);

(44) use, or inclusion, of spring segments that are constrained upon use by an internal frame structure that forms part of the probes;

(45) use, or inclusion, of probes with individual spring segments formed from a single layer, formed from two layers, or formed from more than two layers; and

(46) use, or inclusion, of probes that meet one or more of the following criteria: (1) have a total uncompressed working length of between 3-4 mm, (2) a spring length of 2.5-3.5 mm, (3) an over-travel of at least 300 microns, and (4) a maximum force at maximum over travel of 1.5-3.0 grams.

Numerous other variations are possible, some of which are explicitly or implicitly set forth herein while others will be apparent to those of skill in the art after review of the teachings herein. Some variations include using such probes in testing integrated circuits, dies on semiconductor wafers, or other electronic circuits. Other variations include assembly of a plurality of such probes into arrays for use in testing applications or for use in permanent contact applications. Further embodiments include methods for making such probes or making such arrays.

First Group of Embodiments: Probes with at Least One Tensional Spring Element or Segment without a Sheath FIGS. 2A-3I provide probes according to a number of embodiment variations within the first group of embodiments of the invention wherein spring segments and structural elements illustrate a number of different example configurations of probes having at least one tensional spring but not a sheath.

Figure 2A:
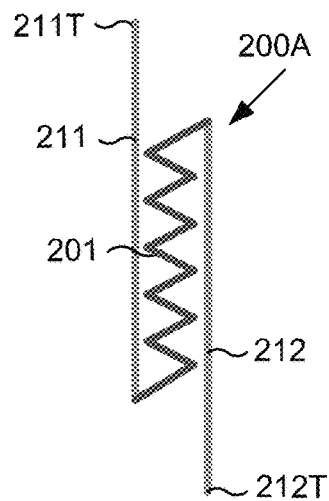
FIG. 2A provides a schematic representation of a side view of a vertically oriented probe that includes a single flat tensional spring connected to two tip arms that extend in opposite directions relative to their associated spring ends such that the spring operates in tension when the tips are pressed toward one another.

FIG. 2A provides a schematic representation of a side view of a vertically oriented probe 200A that includes a single flat tensional spring 201 connected to two tip arms 211 and 212 that extend in opposite directions relative to their associated spring ends such that the spring operates in tension when the tips 211T and 212T are pressed toward one another wherein the arms are shown as being located along the edges of the spring segment but could alternatively be located along and spaced slightly from either face of the segment or both could be located along a single face of the segment and could potentially function as shield that protects that face of the segment.

Figure 2B:
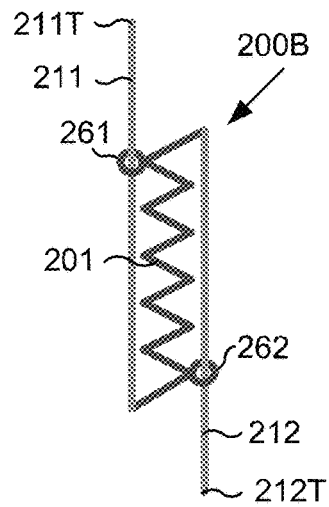
FIG. 2B provides a schematic representation of a side view of a vertically oriented probe having a configuration similar to that of FIG. 2A but additionally including an upper and lower coupling ring that provides for the arms to remain joined to the edges of the spring segments in a slidable configuration.

FIG. 2B provides a schematic representation of a side view of a vertically oriented probe 200B having a configuration similar to that of FIG. 2A but additionally including coupling rings 261 and 262 that provide for the arms 211 and 212 to remain joined to the edges of selected spring segments in a slidable configuration. In other configurations, the slide rings, the arms, and any other connecting elements could have been formed along one or both faces of the segment so that the arms could alternatively run along one or both faces. In other embodiments, other or additional spring segments could have been attached to slide rings.

Figure 2C:
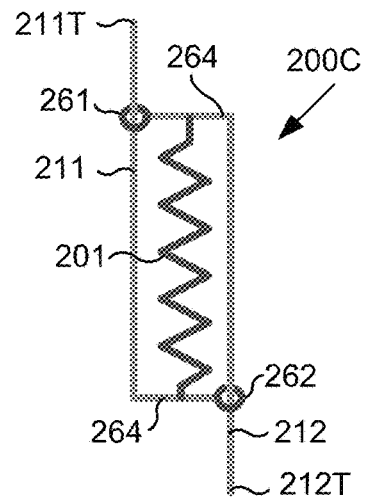
FIG. 2C provides a schematic representation of a side view of a vertically oriented probe having a configuration and functionality similar to that of the probe of FIG. 2B but with the connection rings not being attached to the springs themselves but to lateral extension elements of the tip arms that attach to the top and bottom ends of the segment.

FIG. 2C provides a schematic representation of a side view of a vertically oriented probe 200C having a configuration and functionality similar to that of the probe of FIG. 2B but with the connection rings 261 and 262 not being attached to the springs themselves but to lateral connection elements 264 of the tip arms 211 and 212 that attach to the top and bottom ends of the spring segment.

Figure 2D:
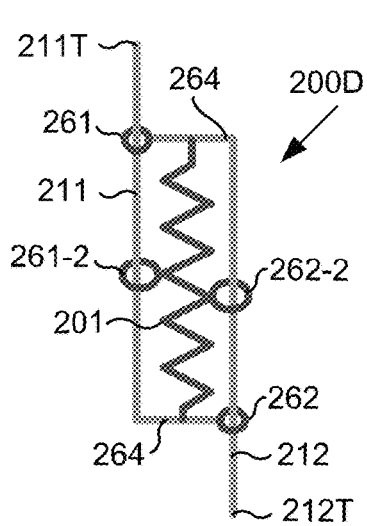
FIG. 2D provides a schematic representation of a side view of a vertically oriented probe having a configuration similar to that of FIG. 2C with the exception that two additional connection or slide rings have been added.

FIG. 2D provides a schematic representation of a side view of a vertically oriented probe 200D having a configuration similar to that of FIG. 2C with the exception that two additional slide or connection rings 261-2 and 262-2 have been added to provide additional movement stability.

Figure 2E:
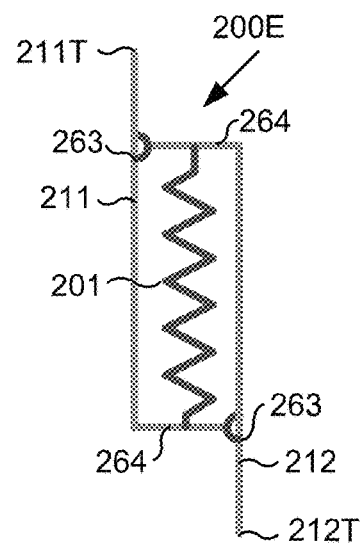
FIG. 2E provides a schematic representation of a side view of a vertically oriented probe having a configuration that is similar to FIG. 2C but where the retention or connection rings are replaced by half rings that provide for sliding but not complete lateral connection of the tip arms to the lateral extension elements.

FIG. 2E provides a schematic representation of a side view of a vertically oriented probe 200E having a configuration that is similar to FIG. 2C but where the retention or connection rings are replaced by half rings 263 that provide for sliding but not complete lateral connection of the tip arms 211 and 212 to the extension elements 264. In other embodiments, the sliding elements may take on other configurations that still allow separation of the connection between the arms and the extension elements while still enhancing desired relative movement ability and/or inhibiting certain unwanted degrees of freedom of the components or structural elements of the probe.

Figure 2F:
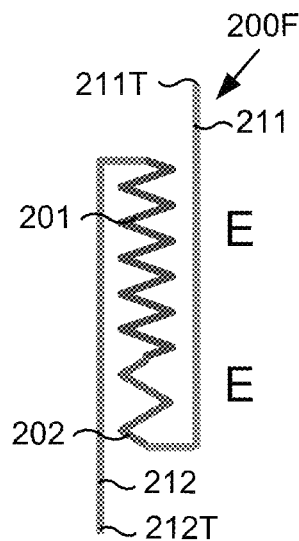
FIG. 2F provides a schematic representation of a side view of a vertically oriented probe that includes two flat tensional springs connected inline and in series with the lower end of the lower spring connecting to the upper tip arm and the upper end of the upper spring connected to the lower tip arm such that the springs operate together in tension (e.g., with a combined spring constant) when the tips are pressed toward one another.

FIG. 2F provides a schematic representation of a side view of a vertically oriented probe 200F that includes two flat tensional springs 202 and 201 connected inline and in series with the lower end of the lower spring 202 connecting to the upper tip arm 211 which connects to upper tip 211T and the upper end of the upper spring 201 connecting to lower tip arm 212 which connects to lower tip 212T such that the springs operate together in tension (e.g., with a combined spring constant) when the tips are pressed toward one another.

Figure 2G:
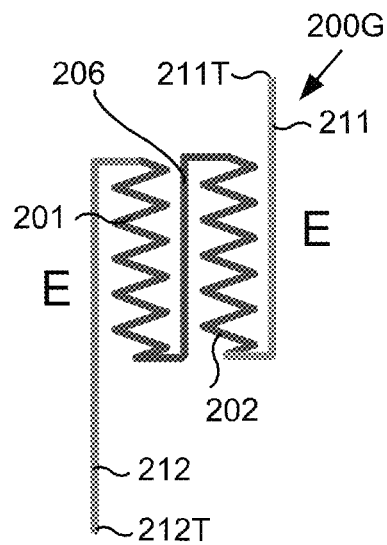
FIG. 2G provides a schematic representation of a side view of a vertically oriented probe that includes two flat tensional springs positioned edge-to-edge (when unbiased) and in series with a connection bar joining the lower end of the left spring to the upper end of the right spring with the lower end of the right spring connecting to the upper tip arm and the upper end of the left spring connected to the lower tip arm such that the springs operate together in tension (e.g., with a combined spring constant) when the tips are pressed toward one another.

FIG. 2G provides a schematic representation of a side view of a vertically oriented probe 200G that includes two flat tensional springs 201 and 202 positioned edge-to-edge (when unbiased) and in series with a connection bar 206 joining the lower end of the left spring 201 to the upper end of the right spring 202 with the lower end of the right spring 202 connecting to the upper tip arm 211 which connects to the upper tip 211T and the upper end of the left spring 201 connecting to lower tip arm 212 which connects to lower tip 212T such that the springs operate together in tension (e.g., with a combined spring constant) when the tips are pressed toward one another.

Figure 2H:
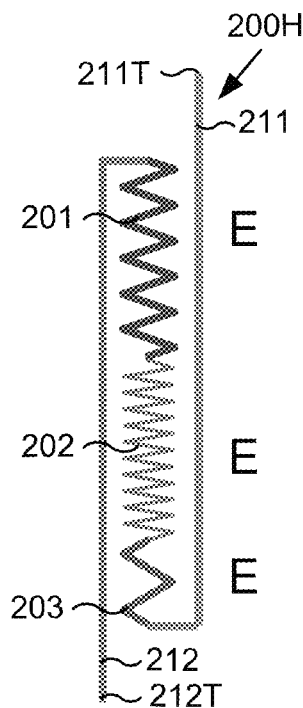
FIG. 2H provides a schematic representation of a side view of a vertically oriented probe that includes three flat tensional springs connected inline and in series with the lower end of the lower spring connecting to the upper tip arm and the upper end of the upper spring connected to the lower tip arm such that the springs operate together in tension (e.g., with a combined spring constant) when the tips are pressed toward one another.

FIG. 2H provides a schematic representation of a side view of a vertically oriented probe 200H that includes three flat tensional springs 201, 202, and 203 connected inline and in series with the lower end of the lower spring 203 connecting to the upper tip arm 211 which connects to upper tip 211T and the upper end of the upper spring 201 connects to lower tip arm 212 that connects to lower tip 212T such that the springs operate together in tension (e.g., with a combined spring constant) when the tips are pressed toward one another.

Figure 2I:
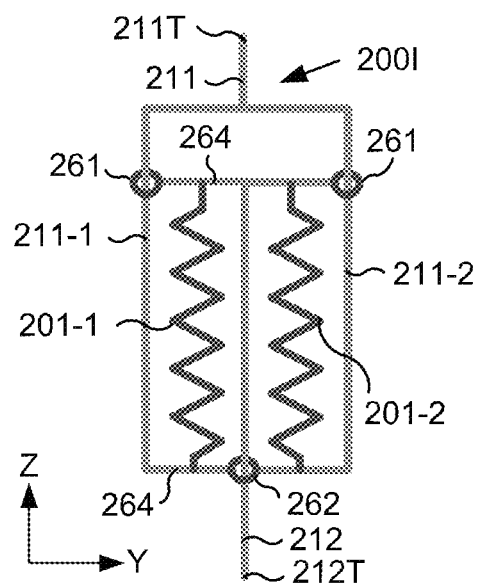
FIG. 2I provides a schematic representation of a side view of a vertically oriented probe having a configuration that provides two extension spring segments that operate in parallel to provide a longitudinal and tensional return force when tips of arms are compressed toward one another.

FIG. 2I provides a schematic representation of a side view of a vertically oriented probe 200I having a configuration that provides two extension spring segments 201-1 and 201-2 that operate in parallel to provide a longitudinal and tensional return force when tips 211T and 212T of arms 211 and 212 are compressed toward one another. More specifically, the compression of the end tips 211T and 212T of arms 211 and 212 cause relative movement of arm 212 and the branches 211-1 and 211-2 of tip arm 211 which in turn cause increased spacing between the upper and lower lateral connecting arms 264 which slide along branches 211-1, 211-2, and tip arm 212 via connecting slip rings 261 and 262 which in turn cause tensional extension (in Z) of both spring segments. Though, as in the previous illustrations, the arms are shown in the same plane as the springs, in other variations, the arms could lay in planes above or below (e.g. behind the sheet or in front of the sheet—in X) the springs or the spring segments to allow narrowing of the width of the probe (in Y) while providing some increase in thickness (in X).

Figure 2J:
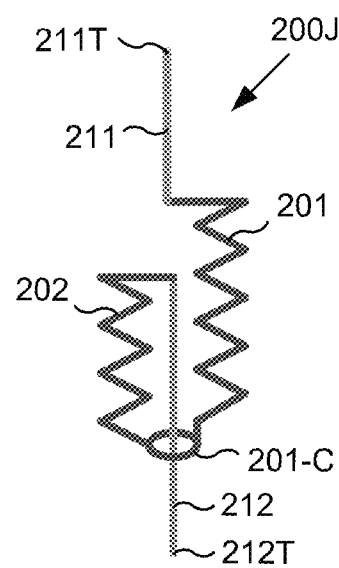
FIG. 2J provides a schematic representation of a side view of a vertically oriented probe having two spring segments with one of the edge-to-edge configured springs operating in compression (201) and the other (202) operating in tension.
Figure 3A:
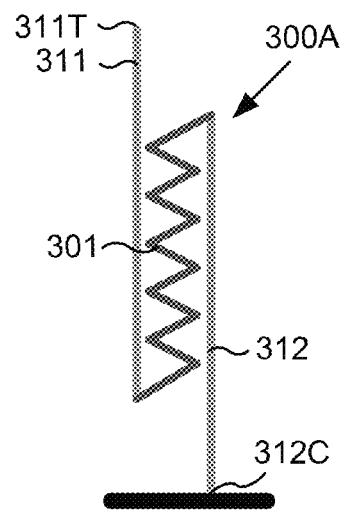
FIGS. 3A-3J provide further example embodiments of probes that are similar to those of FIGS. 2A-2J, respectively, with the difference being that the lower contact tip of each probe is replaced by a bonded, attached, captured, or otherwise retained electrical connection.
Figure 3B:
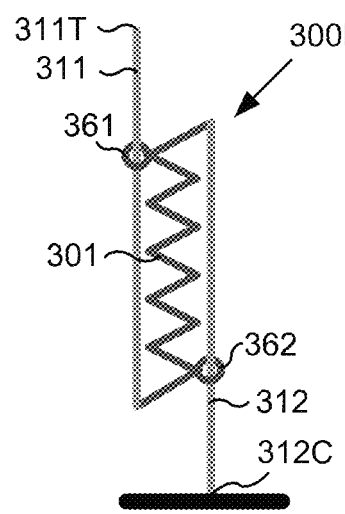
Figure 3C:
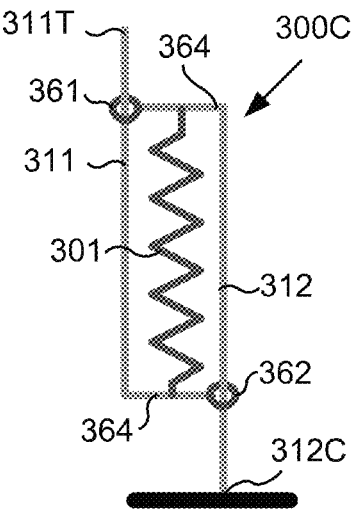
Figure 3D:
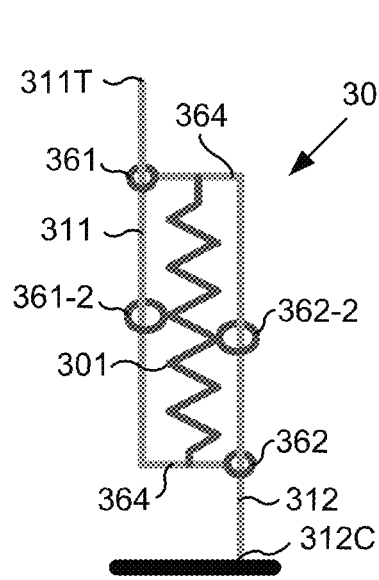
Figure 3E:
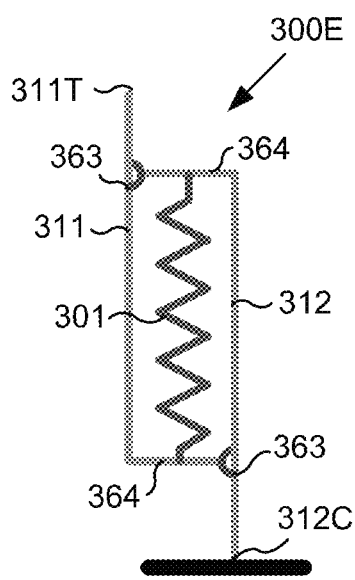
Figure 3F:
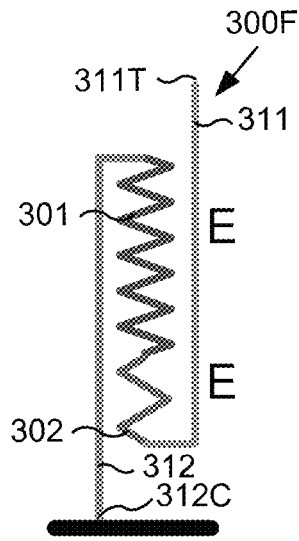
Figure 3G:
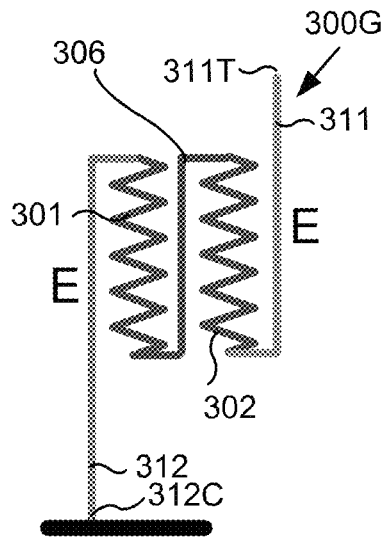
Figure 3H:
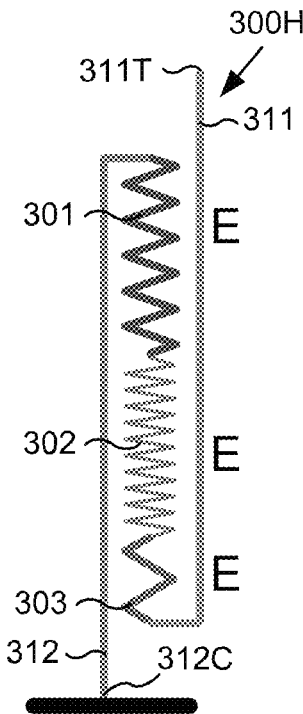
Figure 3I:
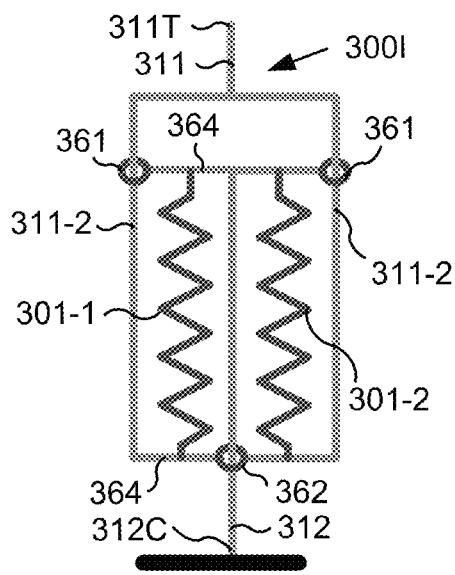
Figure 3J:
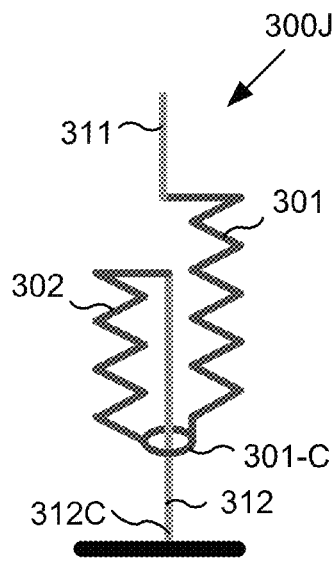

FIG. 2J provides a schematic representation of a side view of a vertically oriented probe 200J having two spring segments with one of the edge-to-edge configured springs operating in compression (201) and the other (202) operating in tension and connected to one another by a slip ring 201-C or other guide structure while in other examples, as with the other embodiments herein, a face-to-face configuration could have been implemented. In some other examples, additional structural features may be added to the probe to aid in probe stability and in particular, to aid in ensuring controlled deflection of the compression spring elements (e.g., to avoid unintended buckling or deflection of the spring that might lead to inadvertent contact, shorting, and/or entanglement between neighboring probes in an array).

FIGS. 3A-3J provide further example embodiments of probes 300A to 300J, respectively, that are similar to probes 200A-200J of FIGS. 2A-2J, respectively, with the difference being that one tip 212T of FIGS. 2A-2J of the two contact tips is replaced by an attached, bonded, captured, or otherwise retained electrical connection 312C. Like features between FIGS. 2A-2J and FIGS. 3A-3J are represented by similar reference numerals with the exception that the reference number series is shifted from 200 to 300. In other embodiments, the roles of the contact tip and the other tip may be reversed.

Second Group of Embodiments: Probe with First and Second Extension Springs Held within Sheath FIG. 4A provides a schematic illustration of a probe 400 similar to that of FIG. 2C with a single tensional spring 401 connected on either end to two tip arms 411 and 412 with corresponding tips 411T and 412T where the arms are connected to the springs via respective stop plates 464L and 464U (i.e. with the lower portion of the upper arm 411 connecting to the lower plate 464L and the upper portion of the lower arm connecting to the upper plate 464U), wherein the upper plate has an opening 461U and the lower plate has an opening 461L through which the respective arm can pass freely with the walls of the openings functioning as longitudinal movement guides (i.e. the walls of the openings electric connection is to be made).

Figure 4A:
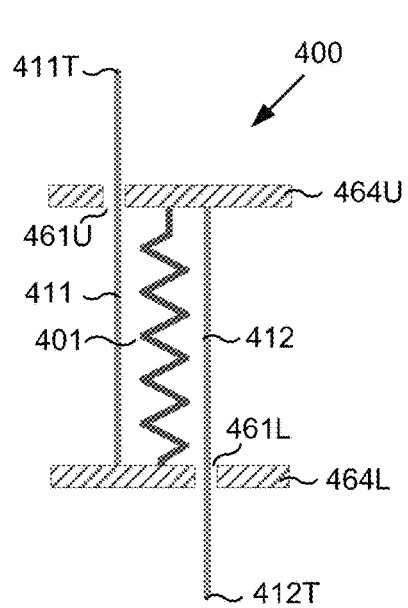
FIG. 4A provides a schematic illustration of a probe similar to that of FIG. 2C with a single tensional spring connected on both ends to tip arms with corresponding tips and where the arms are connected to the springs via respective stop plates and passing through openings in the opposing stop plates such that the stop plates may function as movable plates during probe operation.
Figures 1, 4B:
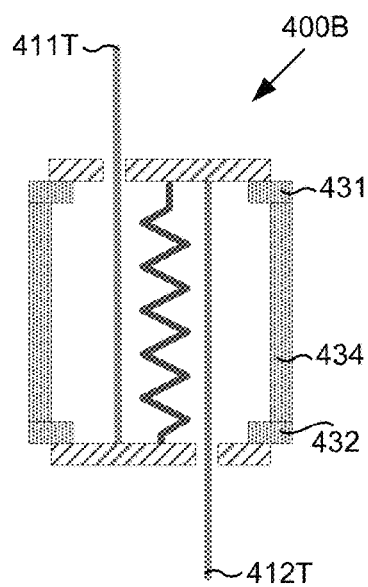
FIGS. 4B-1 to 4B-3 provides schematic illustrations of the probe of FIG. 4A with the probe further including a sheath or frame structure that sets a minimum distance between the stop plates where
Figures 2, 4B:
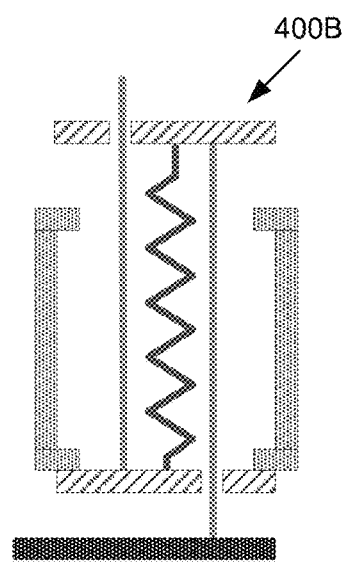
Figures 3, 4B:
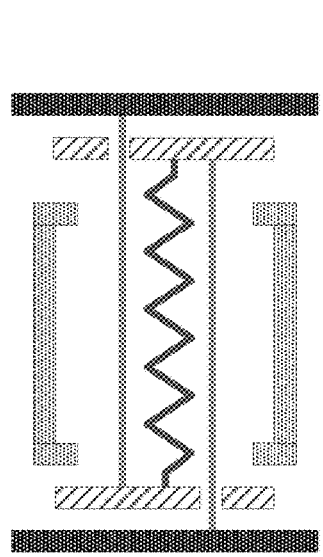

FIGS. 4B-1 to 4B-3 provide schematic illustrations of a probe 400B, similar to probe 400 of FIG. 4A, with the probe further including a sheath or frame structure with a left side and right side being shown that sets a minimum distance between the stop plates with the sheath including upper stop features 431, lower stop features 432, and spacer or standoff sections 434. FIG. 4B-1 shows the probe in an undeflected state with the movable stops resting against the upper and lower portions of the sheath. FIG. 4B-2 shows the probe with the lower tip compressed toward the sheath (e.g., by contact with a lower contact structure that is moved toward the bottom of the sheath) with the spring being biased or stretched as the top movable plate is forced away from the top of the sheath. FIG. 4B-3 shows the probe after the upper tip is compressed toward the sheath (e.g., by contact with an upper contact structure that is moved toward the top of the sheath) with the spring being further biased or stretched as the lower movable plate is forced away from the lower portion of the sheath. In some embodiments, the sheaths may be provided with solid front and back faces or front and back frame structures that help provide lateral guidance during plate movement. In some embodiments, the sheath and/or the movable plates may include additional features that allow for retention of relative lateral positions during longitudinal movement of the probe arms and connected plates and spring relative to the sheath.

Figure 4C:
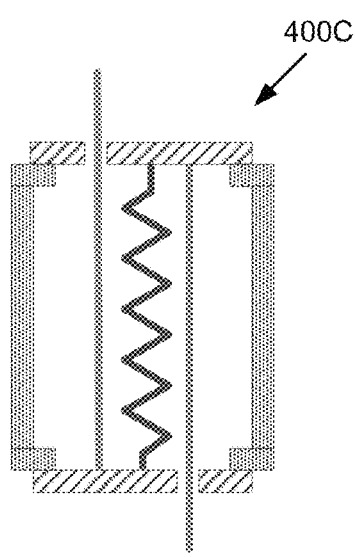
FIG. 4C provides another schematic illustration of the probe of FIG. 4A with the spring being pre-biased by use of a taller sheath or frame structure that holds the movable stops at a larger relative separation, thus ensuring that an initial contact of either tip against a surface (e.g. a pad, bump, or other contact surface of an electrical circuit element) will be accompanied by a non-zero back force.

FIG. 4C provides another schematic illustration of a probe 400C, similar to probe 400 of FIG. 4A, with the spring being pre-biased by use of a taller sheath or frame structure that holds the movable stops at a larger relative separation, thus ensuring that an initial contact of either tip against a surface (e.g. a pad, bump, or other contact surface of an electrical circuit element) will be accompanied by a non-zero back force.

Figures 1, 2, 5A, 5B:
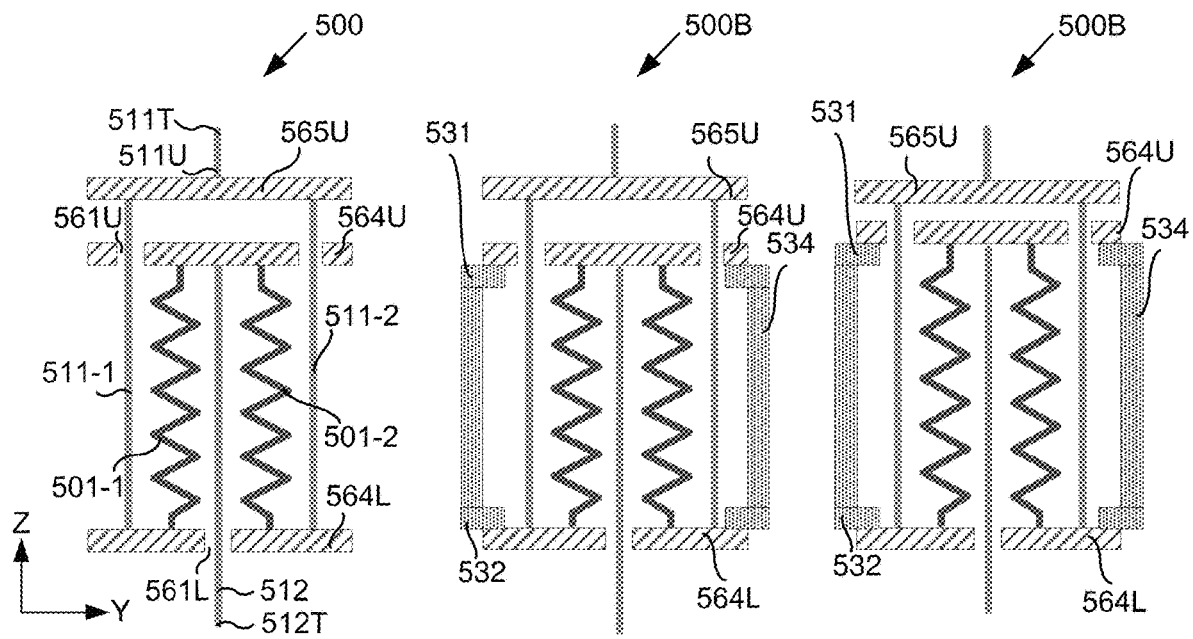

FIG. 5A provides a schematic illustration of a probe 500 similar to that of FIG. 2I with two tensional springs 501-1 and 501-2 functionally connected in parallel and with additional structural emphasis added to the three structural members that may function as movable stops. The probe 500 of FIG. 5A has two tensional springs 501-1 and 501-2 functionally connected in parallel and connected on top to a movable stop 564U which includes two openings for passing longitudinal tip arms 511-1 and 511-2. The movable stop 564U connects to the upper end of lower tip arm 512 which in turn ends at, or connects to, lower tip 512T. The two tensional springs connect on their bottoms at bar or plate 564L that connects to the bottom of tip arms 511-1 and 511-2 which in turn connect, at their tops, to a crossbar or plate 565U, that may function as a movable stop, which in turn connects to upper tip arm 511U which connects to tip 511T. The probe of FIG. 5A includes three potential movable stop features but with only two degrees of freedom since crossbar or plate 565U and bar or plate 564L are rigidly connected as such viable combinations for engaging independent pairs of the potentially movable stops include: (1) engaging plate 565U and plate 564U or (2) engaging plate 564L and 564U.

FIGS. 5B-1 to 5B-2 provide first and second variations of the probe of FIG. 5A but with the addition of sheaths or frame structures. The probes 500B of FIGS. 5B-1 and 5B-2 have pairs of stops that set the minimum distance between the upper and lower moving stops. Stop 531 sets the lower position of upper movable stop 564U by bounding the upper movable stop 564U to upward relative motion. Stop 532 sets the upper position of lower movable stop 564L by bounding the lower movable stop 564L to downward relative motion. The minimum distance set by the stops of FIG. 5B-1 is the same separation distance shown in FIG. 5A while the minimum distance set by the stops of FIG. 5B-2 is larger than the separation distance shown in FIG. 5A. Worded another way, the probe of FIG. 5B-2 has an initial bias that is larger than that of FIG. 5B-1. The amount of working compression range of the probes of FIGS. 5B-1 and 5B-2 may be set by the lengths of arms 511-1 and 512 or the gap between 564U and 564L because either of these may dictate the elastic range of motion allowed. In other embodiments, different parameters, structures, or features may be used to set the working range of motion.

Figures 1, 2, 5C:
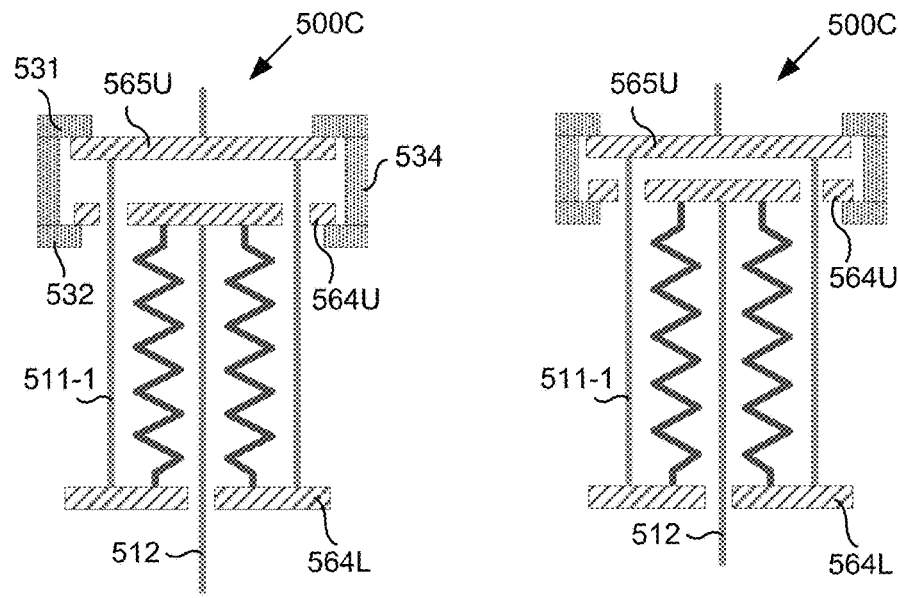

The probes 500C of FIGS. 5C-1 and 5C-2 provide third and fourth variations of the probe of FIG. 5A with each having a pair of stops that sets the maximum distance between the upper pair of movable stops. Stop 531 sets the upper position of movable stop 565U by bounding movable stop 564U to downward relative motion. Stop 532 sets the lower position of lower movable stop 564L by bounding the lower movable stop 564L to upward relative motion. The gap between stops 531 and 532 of FIG. 5C-1 should be adequate to provide a desired extent of compressive motion for the tips of the probe. The maximum distance set by the stops of FIG. 5C-1 is the same separation distance shown in FIG. 5A while the maximum distance set by the stops of FIG. 5C-2 is smaller than the separation distance shown in FIG. 5A. Worded another way, the probe of FIG. 5C-2 has an initial bias that is larger than that of FIG. 5C-1. The amount of working compression range of the probes of FIGS. 5C-1 and 5C-2 may be set by the lengths of arms 511-1 and 512 or the gap between 564U and 564L because either of these may dictate the elastic range of motion allowed. In other embodiments, different parameters, structures, or features may be used to set the working range of motion.

In some variations of the embodiments of FIGS. 5A to 5C-2, different spacing heights may be used for the fixed stops, different lengths of arms and springs may be used, additional guide structures may be added, tabs or other structures may be added to the sheaths or frame structures to provide controlled engagement with array structures (e.g. guide plates, substrates, other probes, or the like), and dielectric features may be added to provide electric isolation of selected elements within a given probe or between neighboring probes.

FIG. 6A provides a schematic illustration of a probe 600 similar to that of FIG. 2J with a tensional spring 601-2 and a compression spring 601 functionally connected side by side in series by a movable stop structure 664L at their lower ends. Stop structure 664L includes an opening through which arm 612 can pass. An upper end of arm 612, along with an upper end of spring 602 attaches to another movable stop 664M that includes an opening for passing spring 601. An upper end of spring 601 connects to a movable stop 664U as does a lower end of upper tip arm 611 which joins tip 611T at its opposite end. A lower end of lower tip arm 612 joins tip 612T.

FIGS. 6B-1 to 6B-2 provide first and second variations of a probe 600B, similar to probe 600 of FIG. 6A but with the addition of sheaths or frame structures having upper stops 631, lower stops 632 and spacers or standoffs 634 that set the maximum distance between a first pair of movable stops (i.e., the top and bottom stops) with the maximum distance of FIG. 6B-1 being the same separation distance shown in FIG. 6A while the maximum distance of FIG. 6B-2 being smaller than the separation distance shown in FIG. 6A. Worded another way, the probe of FIG. 6B-2 has an initial bias that is larger than that of FIG. 6B-1. The amount of working compression range of the probes of FIGS. 6B-1 and 6B-2 may be set by the lengths of arms 611 and 612 or the gap between 664U and 664M because either of these may dictate the elastic range of motion allowed. In other embodiments, different parameters, structures, or features may be used to set the working range of motion.

FIG. 6C-1 to 6C-2 provide third and fourth variations of a probe 600C, similar to probe 600 of FIG. 6A but with the addition of sheaths or frame structures that set a maximum distance between a second pair of movable stops (i.e., the middle and top stops) with the maximum distance of FIG. 6C-1 being the same separation distance shown in FIG. 6A while the maximum distance of FIG. 6C-2 being smaller than the separation distance shown in FIG. 6A. Worded another way, the probe of FIG. 6C-2 has an initial bias that is larger than that of FIG. 6C-1. The amount of working compression range of the probes of FIGS. 6C-1 and 6C-2 may be set by the lengths of arms 611 and 612 or the gap between 664U and 664M because either of these may dictate the elastic range of motion allowed. In other embodiments, different parameters, structures, or features may be used to set the working range of motion.

In some variations of the embodiments of FIGS. 6A to 6C-2, different spacing heights may be used for the fixed stops, different lengths of arms and springs may be used, additional guide structures may be added, tabs or other structures may be added to the sheaths or frame structures to provide controlled engagement with array structures (e.g. guide plates, substrates, other probes, or the like), and dielectric features may be added to provide electric isolation of selected elements within a given probe or between neighboring probes.

FIGS. 7A-7C provide schematic illustrations of three example probes having three tensional springs located in series with the probes also having movable stops as well as upper and lower tips and arms with fixed stops also shown in FIGS. 7B and 7C. Probe 700 of FIG. 7A includes an upper tip 711T at the upper end of an upper arm 711. The lower end of the upper arm is attached to a movable stop or lateral extension arm 724 with the stop having an opening 761 that allows passage of a second tip arm 712 and the arm 724 having the lower end of spring 703 attached thereto. The upper end of spring 703 attaches to movable stop 723 to which a lower end of spring 702 attaches, with the stop 723 also including an opening for passing another portion of tip arm 712. An upper end of spring 702 attaches to another movable stop 722 to which a bottom end of spring 701 attaches with the movable stop 722 also having an opening for passage of another portion of arm 712. The upper end spring 701 and the upper end of arm 712 attached to a final movable stop or lateral extension arm 721. FIG. 7B depicts a probe 700B, similar to probe 700 of FIG. 7A, having a fixed stop or a fixed spacing structure that sets a minimum distance between two intermediate movable stops 722 and 723. The spacing structure includes stops 732 and 733 along with a spacing or standard element 734, wherein the minimum spacing distance is the same as the separation distance shown in FIG. 7A. FIG. 7C shows a probe 700C, similar to probe 700 of FIG. 7A, with the fixed stop or fixed spacing structure of FIG. 7B but with the spacer or standoff 734 being taller. Interactions between springs, the fixed stops, the moving stops, along with pre-tensioning of one or more springs prior to usage can lead to overall spring constant variations (e.g., decreases) over a working compression range of the probe tips 711T and 712T toward one another, as is discussed in more detail in currently filed U.S. application Ser. No. 17/139,936. In other examples, variations are possible where one spring or two springs operate in compression while the other two springs or one spring operate in tension. In still other variations, the springs and/or the arms could all be overlaid in a variety of face-to-face or edge-to-edge configurations with the arms running outside or between the various spring segments.

Figure 8:
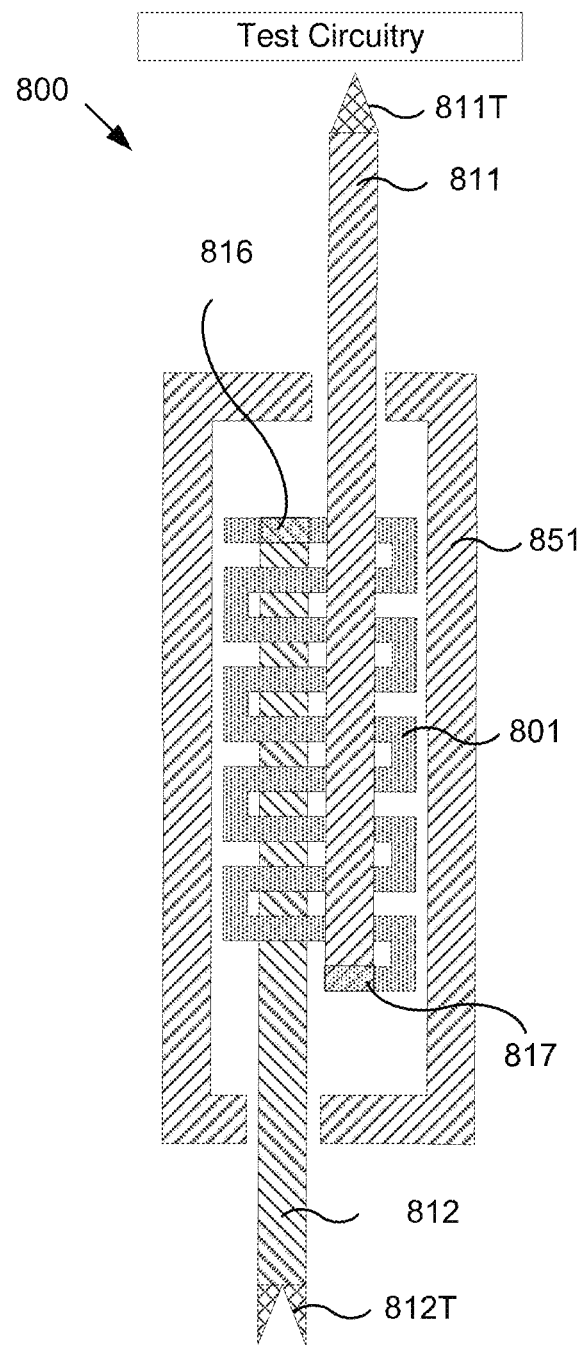
FIG. 8 provides a schematic representation of a probe according to another embodiment of the invention where the probe includes a single spring segment (like that of FIG. 2A or 2B), an upper arm and tip which are positioned in front of the plane or layer of the spring, and a lower arm and tip that are positioned behind the plane or layer of the spring.

FIG. 8 provides a schematic representation of a probe 800 according to another embodiment of the invention where the probe includes a single spring segment 801 (like that of FIG. 2A or 2B) that is operated by pressing on upper tip 811T, which is connected to arm 811 with both being positioned in front of the plane or layer of the spring, and lower tip 812T, which is connected to arm 812 with both being positioned behind the plane or layer of the spring and where the ends of the spring engage the arms at locations 817 and 818 which are longitudinally opposite to their respective tip locations and wherein the arms run along opposite faces of the spring segment and extend longitudinally beyond the ends of the sheath 851. Gaps also separate the spring faces and the arms except at the connection locations 816 and 817. In some embodiments, the front and back of the sheath may be fully closed, be partially closed, or remain open. Similarly, the sides of the sheath may be fully closed or partially open. In the illustration of FIG. 8, the front and back faces are shown as open. Numerous other alternatives are also possible: for example: (1) arm positioning may be opposite to that shown, (2) both arms may be positioned on the same side of the spring, (3) both arms may be aligned with one another in front of or behind the spring, (4) both arms may be located on either side of the spring with their respective tips located in line with the arms or with tips translated to a common line (e.g. a center line) of the probe by inclusion of laterally extending translating arms (e.g. that may be located beyond the working range of the spring), or (5) one or both arms may be located beyond either edge of the spring, within a plane or layer of the spring or in a separate plane or layer with their respective tips located in line with the arms or with tips translated to a different line (e.g. a center line) of the probe by laterally extending translating arms (e.g. that may be located beyond the working range of the spring). Still numerous other variations are possible with some set forth herein as features of other embodiments or as alternatives associated with other embodiments.

Third Group of Embodiments: Assembly of Multi-Spring Probes into Arrays with Pre-Loading of Tensional Springs FIGS. 9A-9J provide side section illustrations of various states in a process of assembling a probe array with pretensioned spring probes. In particular, the side section illustrations show a plurality of probes (two probes in this illustration) being loaded into an array frame that provides intended lateral (XY) positioning of the probes along with pre-loading or biasing of an extension spring while allowing upper and lower moving stop elements to move upward and downward respectively while maintaining a minimum downward position of the upper moving stops and a maximum upward position of the lower moving stops at positions dictated by the upper and lower fixed stops wherein fixed stop positions are at different longitudinal heights on either side of each probe and wherein at least some of the fixed stop positions are set by the relative lateral sliding of the stop plates.

Figure 9A:
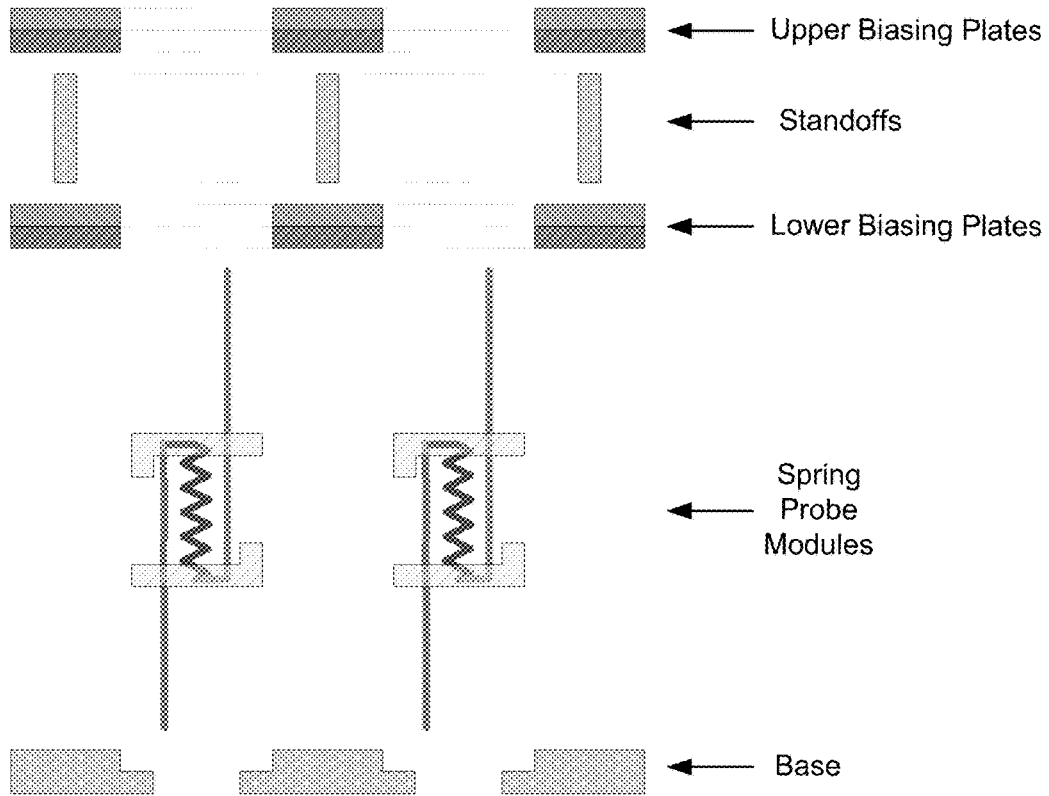
FIGS. 9A-9J provide side section illustrations of various states in a process of assembling a probe array with pretensioned spring probes according to an embodiment of the invention.
Figure 9B:
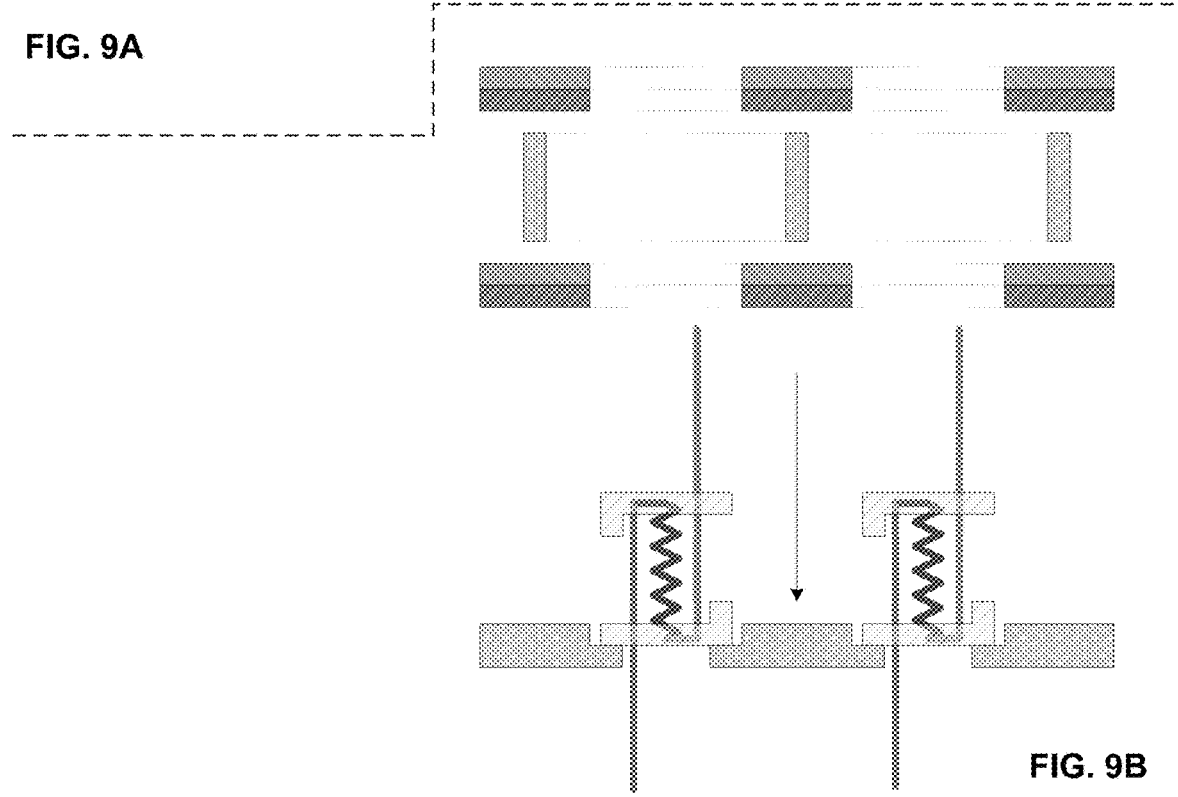
Figure 9C:
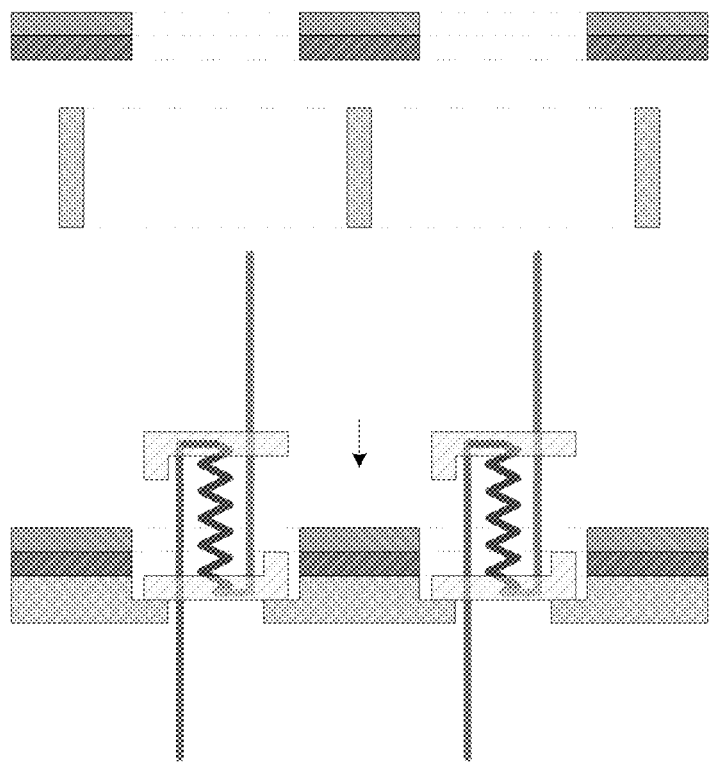
Figure 9D:
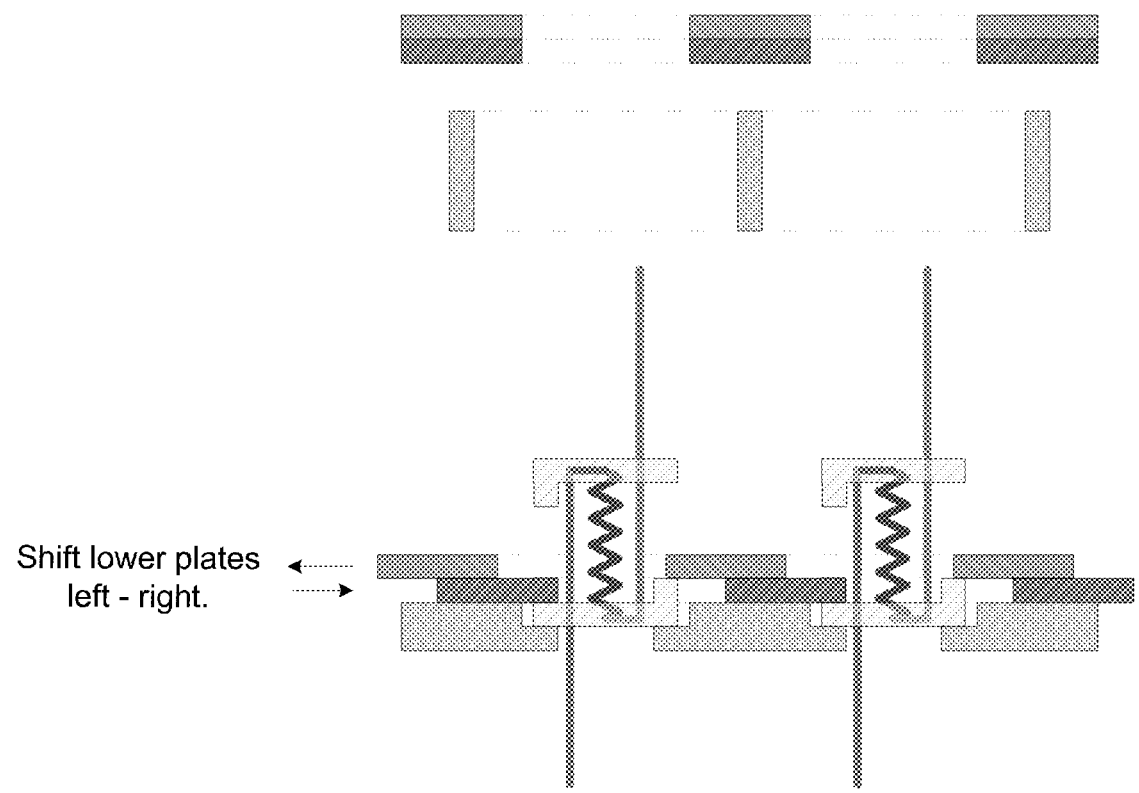
Figure 9E:
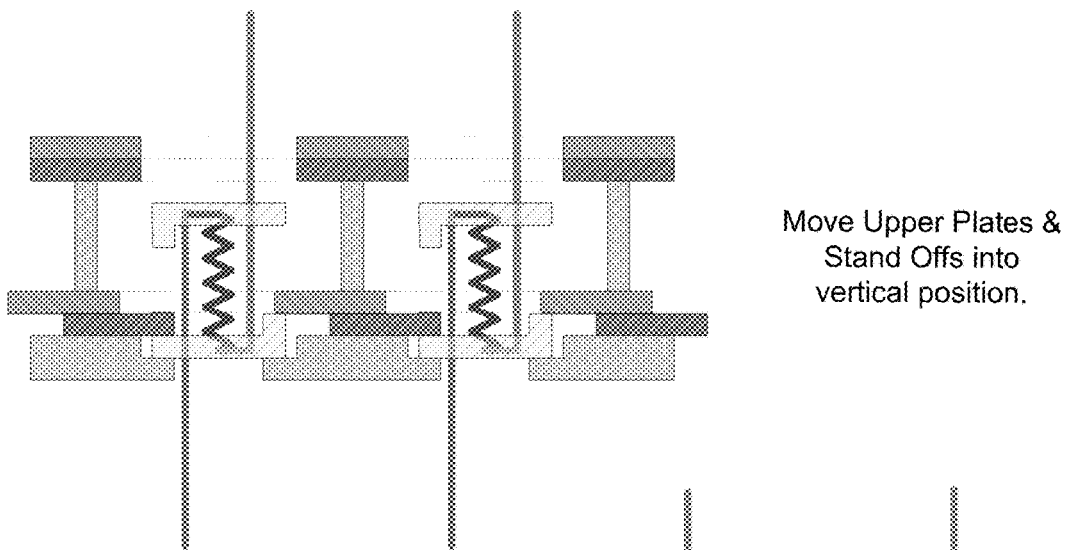
Figure 9F:
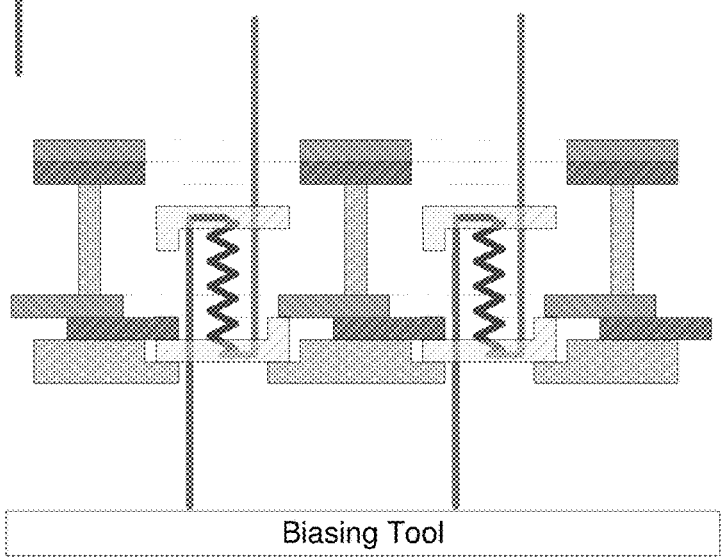
Figure 9G:
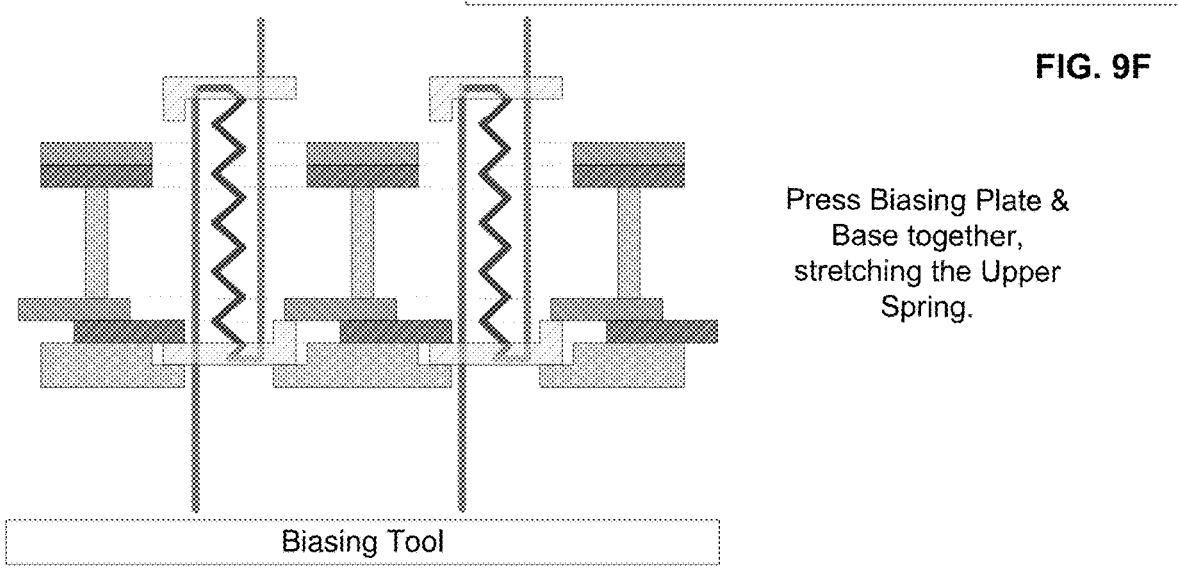
Figure 9H:
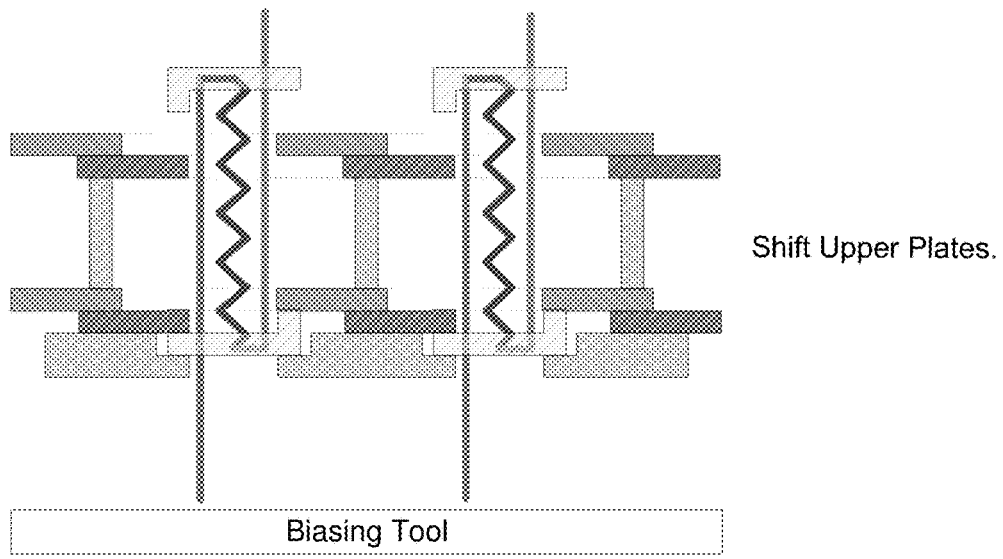
Figure 9I:
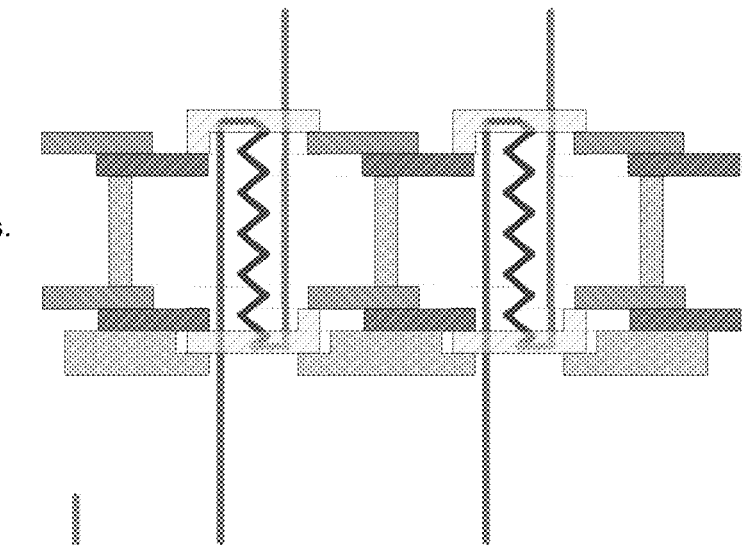
Figure 9J:
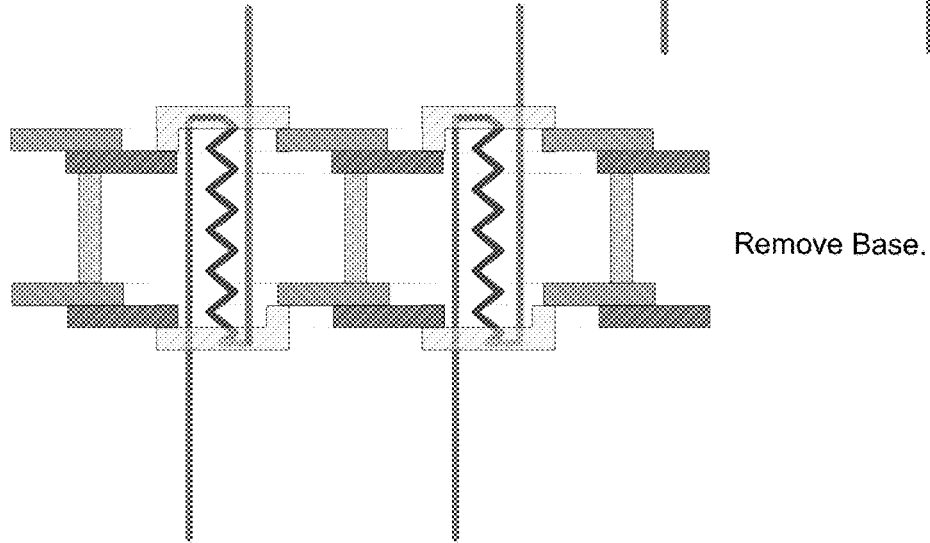

FIG. 9A provides a side schematic representation of an initial state in a probe array assembly process where a base, probes, a lower biasing or stop plate pair, standoffs, and an upper biasing or stop plate pair are shown as being longitudinally separated and laterally aligned. The lower biasing plate pair and the upper biasing plate pair include a bottom plate and a top plate that can be laterally shifted relative to one another while maintaining their longitudinal proximity. FIG. 9B shows the probes and the base after being brought together longitudinally. FIG. 9C shows the lower stop plate pair being shifted longitudinally to a position on or near the base. FIG. 9D shows the state of the process after relative lateral movement that splits the bottom and top biasing plates of the lower pair laterally to close the openings and trap the probe's movable stop plate temporarily against the base. As shown, the left side of the lower movable stops of the probes are captured by the right edges of openings in the lower biasing plate while the slightly higher right side of the lower movable stops of the probes are captured by the slightly higher left edges of the openings in the top biasing plate (of the lower set of plates) such that the probes are temporarily restrained by the base and the lower biasing plate pair. FIG. 9E illustrates the state of the process after the standoffs and upper fixed stop plate set are lowered into contact with each other and into contact with the upper plate of the lower set. FIG. 9F shows the state of the process after a biasing tool is moved into position below the lower probe tips. FIG. 9G shows the state of the process after relative longitudinal movement of the biasing tool and the base (or of some other features of the probes or probe frames) causes the spring to extend such that the lower surface of the upper movable stop is located above the longitudinal level of the lower surface of the top biasing plate of the upper biasing plate pair. FIG. 9H shows the state of the process after relative lateral movement of the bottom and top biasing plates of the upper plate pair such that the right edges of the openings in the bottom plate move laterally under the left edges of movable upper stops of the probes and the left edges of the openings in the top biasing plate are below the right edges of the upper movable stops of the probes. FIG. 9I shows the state of the process after relative longitudinal movement of the base and the biasing tool allow the upper springs to contract so as to allow the upper movable probe stops to contact the upper plate pair while still maintaining some tensional biasing of the springs. FIG. 9J shows the state of the process after the base has been removed, leaving only the configured probe array with the biasing plates being used as guide plates for the array while allowing the probe tips to be compressed toward one another when making electrical contact with circuit elements while allowing the upper movable stops to move upward and the lower movable stops to move downward, thus allowing the compliance of the springs to provide controlled mating of the probes and the circuit elements. In alternative embodiments, the movable stops of the probe may not have raised and lowered plate engagement features as any height difference associated with the side-to-side displacement of the upper and lower biasing plates of a biasing plate pair may be insignificant or otherwise acceptable. In other embodiments, additional plates may be included within a pair so as to provide a higher level of surface engagement (e.g., three plates undergoing lateral displacement along 120° orientations, or four plates undergoing displacement at 90° orientations). In still other alternative embodiments, different probe structures may be used instead of the example shown. Similar processes may be used to cause loading of springs into multiple probe sheaths to provide pre-biasing of at least one spring in such probes after which the encased probes may be loaded into array frames or guide plates.

Figure 10:
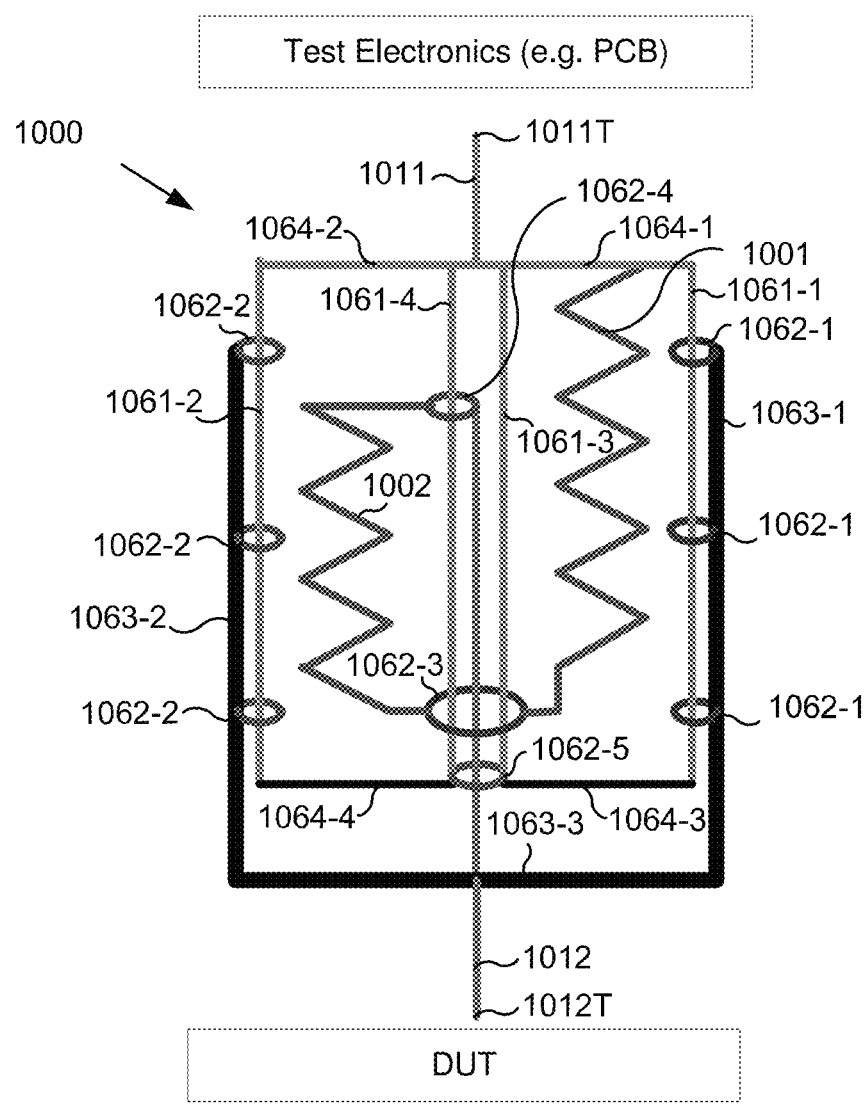
FIG. 10 provides a schematic representation of a probe according to another embodiment of the invention where the probe includes two spring segments with a first segment (on the left) operating in tension and a second segment (on the right) operating in compression, wherein the upper end of the first spring rigidly engages a lower frame structure and probe tip while the upper end of the second spring rigidly engages an upper frame structure and probe tip, and wherein the frame structures can move longitudinally relative to one another via a number of sliding guide structures.

Fourth Group of Embodiments: Probes with a Multiple Springs and Stabilizing Guide Elements FIG. 10 provides a schematic representation of a probe 1000 where tip 1011T results in compression of spring 1001 while movement of lower tip 1012T results in extension of spring 1002. Since the two springs 1001 and 1002 are joined at their lower ends by coupling and guide ring 1062-3, the compressing of spring 1001 has an impact on the net extension of spring 1002 while the extension of spring 1002 has a net impact on the compression of spring 1001. A net force applied to the tips of the probe depends on several factors including the spring constant of each spring, the net deflection of each spring, and any initial bias created in each spring. An upper probe tip is located at the upper end of tip arm 1011 while the other end of the tip arm connects to a relatively rigid sliding frame structure via lateral crossbars 1064-1 & 1064-2 with these bars in turn connecting to the upper end of spring segment 1001 as well as to other frame elements 1061-1 to 1061-4. Frame elements 1061-1 to 1061-4 at their lower ends connect to lateral cross bars 1064-3 and 1064-4 which are joined by the coupling and guide ring 1062-5. The upper portion of spring 1002 connects to slip ring 1062-4 which also connects to tip arm 1012 which ends in tip 1012T. The sliding frame is held by and can slide longitudinally relative to a second frame that includes elements 1063-1 to 1063-3 with an interface between the frames being a plurality of slip rings 1062-1 on the right and 1062-2 on the left which are mounted to the second frame while slidingly engaging the first frame with a relative longitudinal positioning of the frames being a function of the relative position of upper and lower circuit elements (such as a DUT, device under test, or a space transformer or other test circuit interface elements that engage probe tips) along with any other movable or fixed stop to which the probe may engage. The framing elements help in stabilizing probe functionality and may help ensure that the compression spring 1001 does not deflect or bow excessively. In some implementations, additional guide elements may be provided in front and/or behind both faces of one or both springs to provide additional operational stability. For example, initial biasing of one or both springs may be useful in providing different operational characteristics to the probe. For example, selecting and setting a minimum distance between element 1063-3 and 1064-4 that is greater than a nominal unbiased distance or setting a maximum distance between frame elements 1063-3 and 1064-2 may result in pre-biasing of the springs to provide an initial non-zero contact force for the probe.

Figures 1, 11:
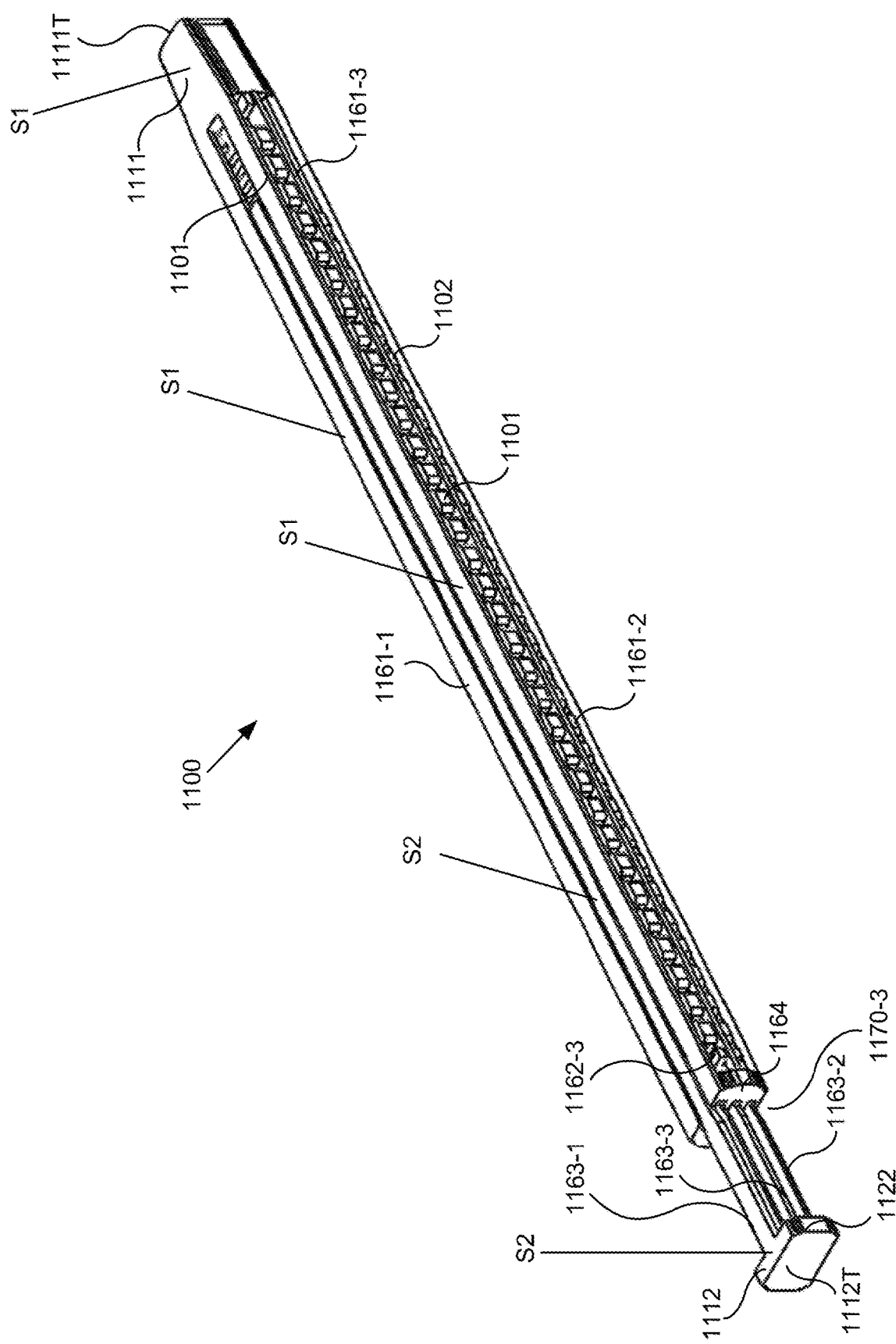
Figures 2, 11:
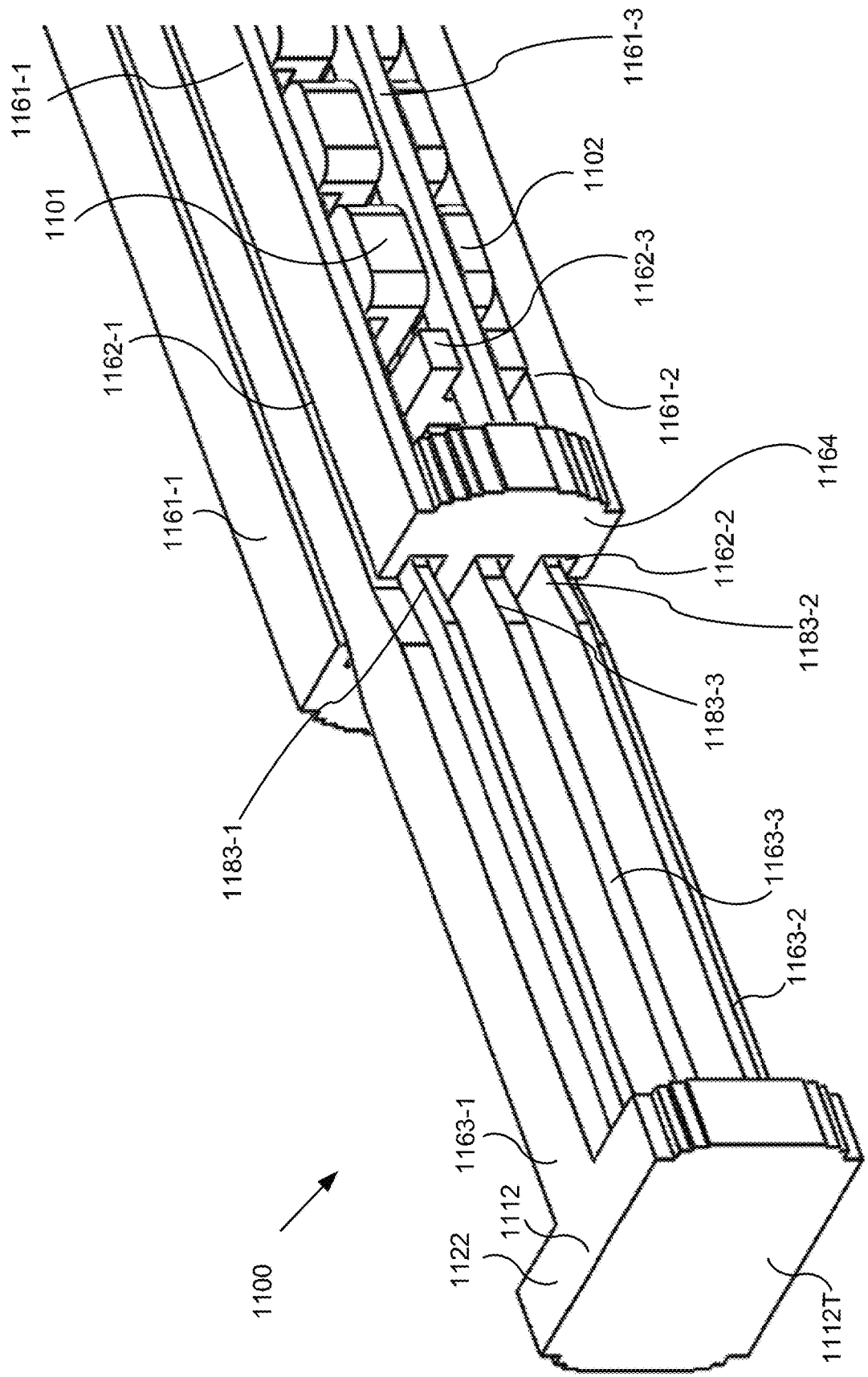
Figures 3, 11:
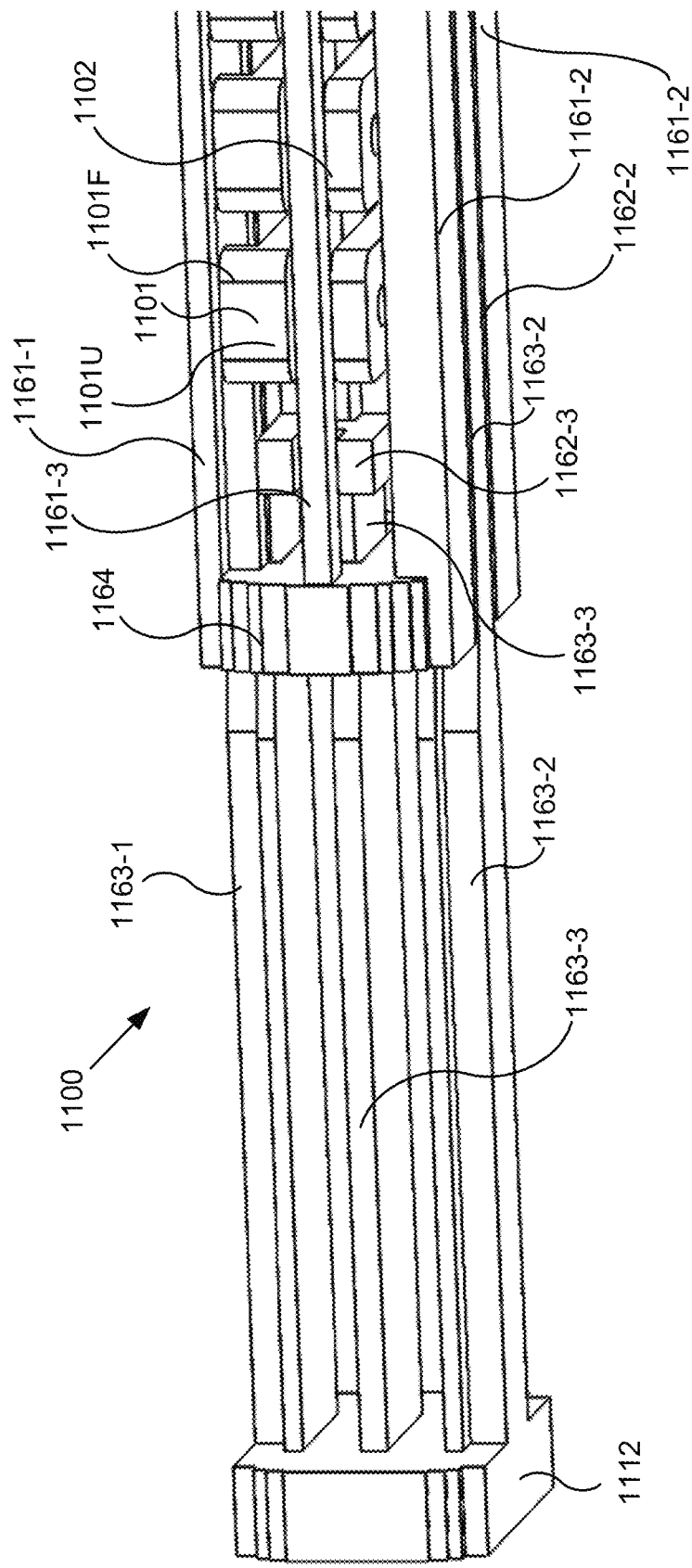
Figures 4, 11:
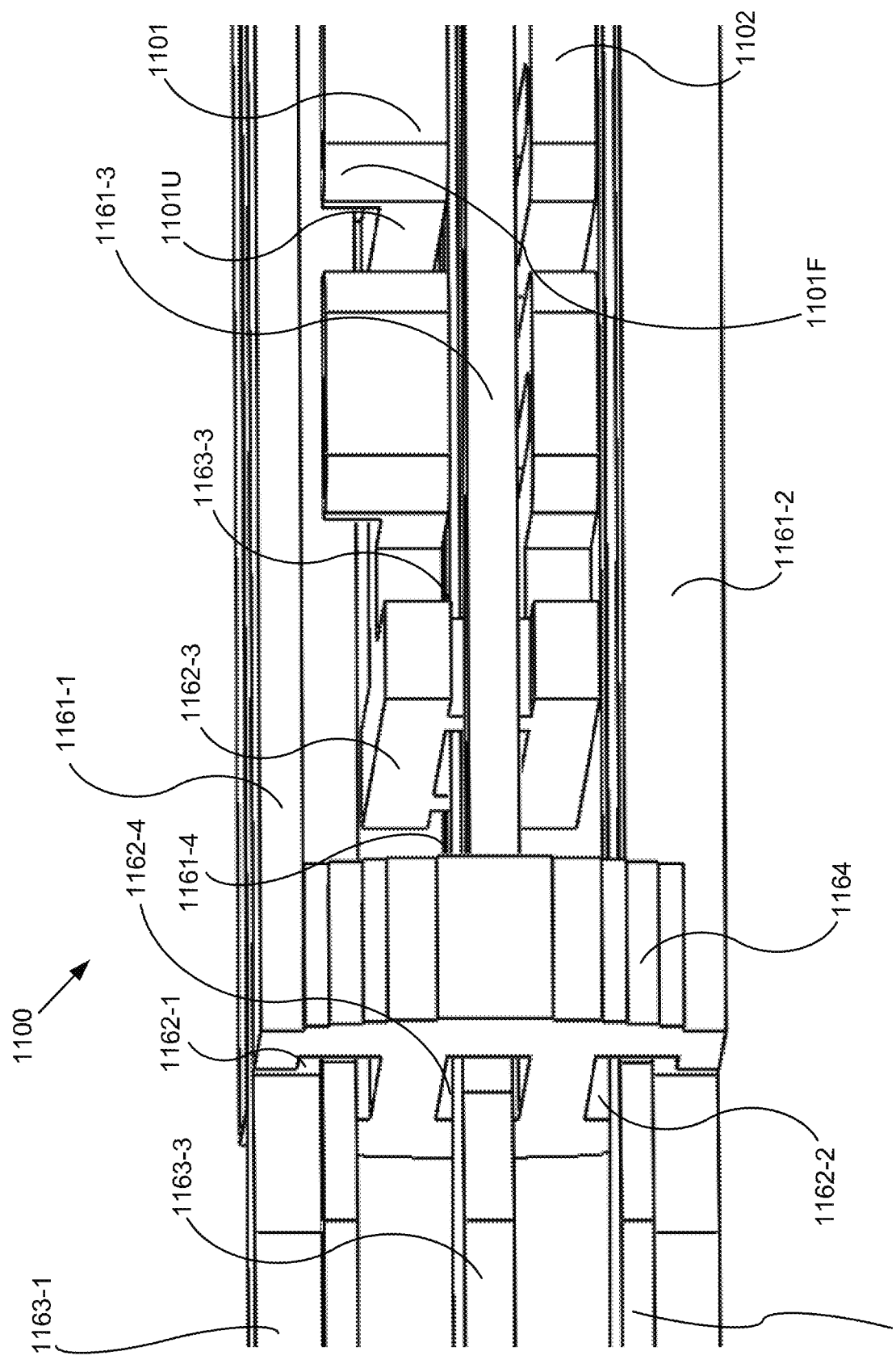
Figures 5, 11:
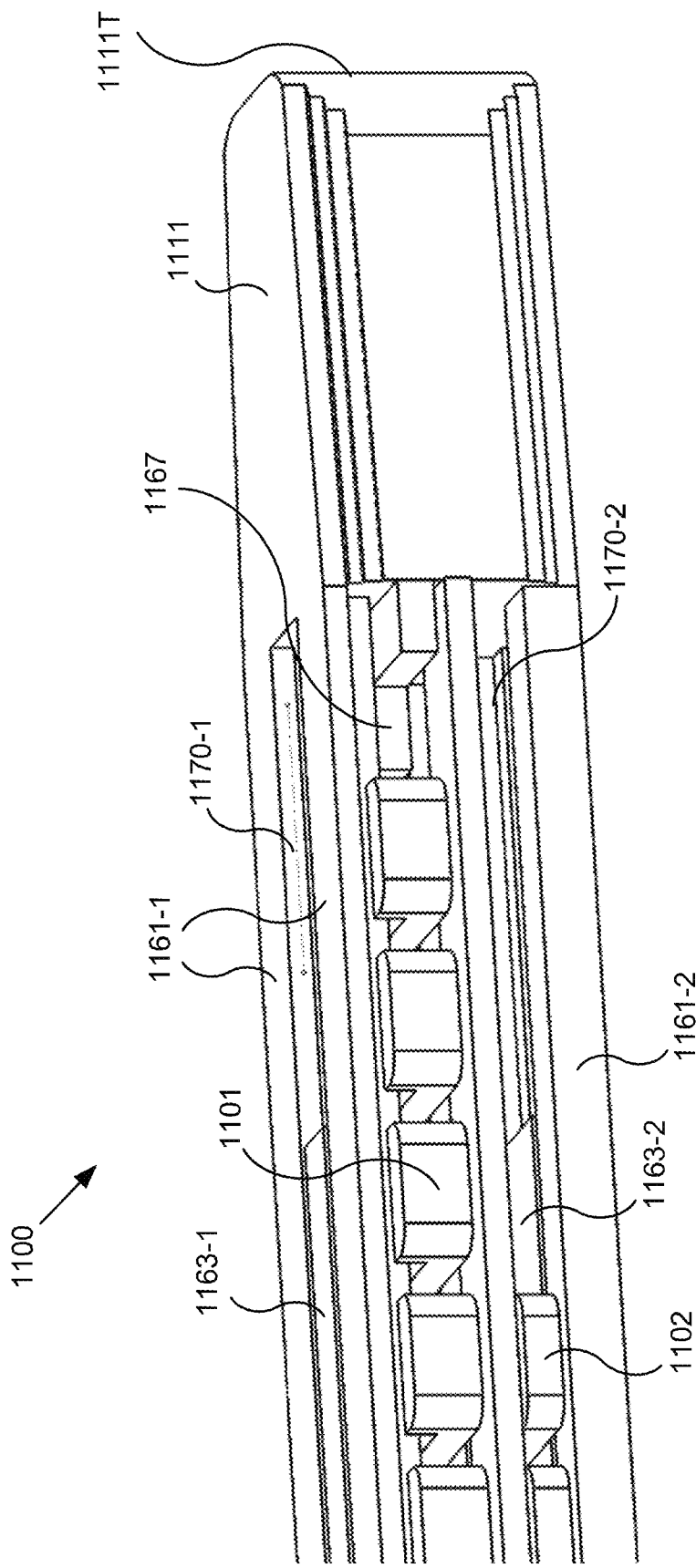

FIG. 11-1 provides an isometric view of a probe 1100 according to another embodiment of the invention that provides functionality and structural relationships similar to those set forth in the probe of FIG. 5 wherein the probe includes first and second relatively movable structures S1 and S2 and compliant elements including two probe segments 1101 and 1102 connected in series. Structure S1 includes the first tip arm 1111 and tip 1111T (which may be used to make contact with a contact or bonding pad of a first electrical circuit element), guide arms 1161-1 to 1161-4 (with only 1161-1 to 1161-3 being visible) and end connector 1164 that joins the guide arms while structure S2 includes guide arms 1163-1 to 1163-3 and movable stop 1122 where S1 and S2 can slide relative to each other. S1 and S2 are connected by a spring assembly or group which includes a tensional portion or segment 1102 that has a right end that joins the right end of S2 and a left end that joins the left end of a compressional spring segment 1101 via a slidable connector 1162-3, which can slide relative to the guide arms of both S1 and S2, which in turn, at a right end, joins S1. The left end of S2 is shown with a flat tip arm 1112 and tip 1112T. The tip 1112T may be used to make electrical connection with a contact pad of a second electrical circuit element (e.g. a DUT or device under test, which may be an integrated circuit still in wafer form) and which, in alternative embodiments, may take on a variety of different forms other than the blunt flat tip configuration of the current example. As shown, flat tip arm 1112 is separated from the right end of S1 to leave a gap 1170-3 that allows compression of tip 1112T toward tip 1111T.

FIG. 11-2 provides a close up view of the left most portion of the probe of FIG. 11-1 so that various key elements can be better seen including: (1) Tip 1112T; (2) Three guide arms 1163-1, 1163-2, and 1163-3 of S2; (3) Main guide arms 1161-1, 1161-2, 1161-3 of structure 1 (1161-4 is out of view but corresponds to 1161-3 on the opposite side of the probe); (4) Sliding interfaces or slots 1162-1 and 1162-2 for the T-shape rails or guides of S2, and the complementary shaped guides 1161-1 and 1161-2 formed by the guide arms of S1; and (5) Tensional segment 1102 and the compressional segment 1101, and the connector 1162-3 that joins the two segments together and allows for sliding along both S1 and S2. Furthermore, in this example, guides 1163-1, 1163-2, and 1163-3 can be seen having narrowed regions 1183-1, 1183-2, and 1183-3, respectively, where the narrowed regions can be used to provide a larger gap between the guides and the openings in end 1164 during fabrication of the assembled but not fully engaged probe (e.g. where formation occurs using a multi-layer electrochemical fabrication method), whereafter S1 and S2 are transitioned to a working or operational configuration by pressing the ends of the probe together wherein the wider regions of the guides are brought into the openings of 1164, thereby narrowing the gap and providing a probe with a more stable operational configuration. For example, during formation, the gap is larger than a minimum feature size (e.g., a size that allows formation of the features to occur with desired or required yield, e.g., 80, 90, 95, or even 99%, or more, feature yield for a given fabrication process) which may be, for example, as large as 5, 10, 20, 30 microns or more. After transition to a work configuration, the gap is smaller than the minimum feature size, for example, and the gap may be reduced to 10, 5, 2 microns or even less. In other probe embodiments of the invention, such configuration size changes between interface regions for fabrication and use may be designed into other probe regions to improve stability and probe operation.

FIG. 11-3 provides an isometric view of the left end of S1 and S2 from a different angle compared to that of FIG. 11-2 so that additional features can be more readily seen such as the retention flanges 1101F at the top of the undulations 1101U of the compressive spring segment 1101 which engages a slot along the bottom of guide arm 1161-3 with similar flanges on the spring segment on the opposite side of the probe engaging a counterpart guide arm 1161-4 on that side (see FIG. 11-4).

FIG. 11-4 provides a view of the left end of S1 from a different angle compared to that of FIG. 11-2 so that additional features may be more readily seen such as: (1) The double I configuration of the connector 1162-3 that joins springs 1101 and 1102 while allowing the central bar 1163-3 of S2 and side bars 1161-3 and 1161-4 of S1 to pass through it; and (2) Flanges 1101F at the ends of undulations 1101U (i.e. the elastically deformable compliant building blocks) of the compression spring segment 1101.

FIG. 11-5 provides an isometric view of the right most ends of S1 and S2 so that select features may be more readily seen such as: (1) Attachment structure 1167 joining the right end of the compression spring segment 1101 to tip arm 1111 of S1; and (2) Gaps 1170-1 and 1170-2 that provide space for elements 1163-1 and 1163-2 to move into during compression of the probe tips 1111T and 1112T toward one another.

Figures 6, 11:
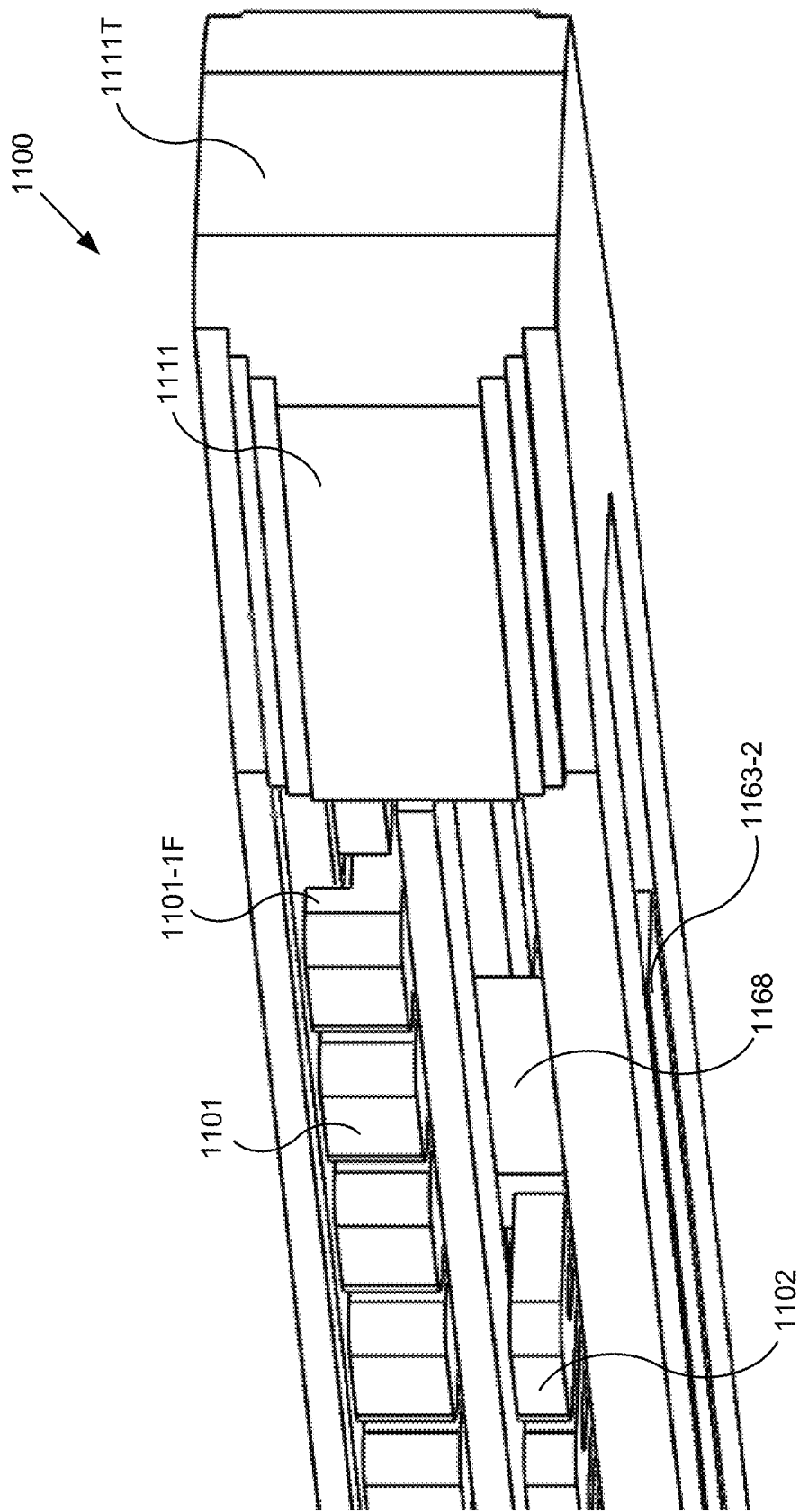

FIG. 11-6 provides an isometric view of the right most ends of S1 and S2 from a different angle than that shown in FIG. 11-5 so that selected features may be more readily seen such as the attachment structure 1168 that joins the right end of the tension spring 1102 to the right end of the lower bar 1163-2 and/or to the central bar 1163-3 of S2.

Numerous variations of this embodiment are possible and include for example: (1) adding to the present embodiment features associated other embodiments or replacing some of the features of the present embodiment with those from one or more other embodiments, (2) using or including a different number of stabilizing guides, (3) using or including a different configuration of stabilizing guides, (4) using or including a different number of springs and with different configurations, including different numbers of segments and/or types of segments and our positional relationships between segments, and/or different connection relationships between segments and other segments or between segments and coupling structures, (5) using or including different tip configurations. (6) using or including different connecting elements that join the spring segments where the connecting elements may or may not provide guide features, (7) using or including fixed stop features, (8) using or including different or additional moving stop features, (9) using or including interface features that aid in aligning with and engaging fixed stop features that are part of array structures, (10) using or including interface features that aid in array loading and retention, and (11) using or including additional features for aiding in the pre-biasing of spring segments.

Still other embodiments may be created by combining the various embodiments and their alternatives with other embodiments and their alternatives as set forth herein.

FURTHER COMMENTS AND CONCLUSIONS

Various other embodiments of the present invention exist. Some of these embodiments may be based on a combination of the teachings herein with various teachings incorporated herein by reference. For example, some fabrication embodiments may not use any blanket deposition process. Some embodiments may use selective deposition processes or blanket deposition processes on some layers that are not electrodeposition processes. Some embodiments may use nickel or nickel-cobalt as a structural material while other embodiments may use different materials. For example, preferred spring materials include nickel (Ni), copper (Cu) in combination with one or more other materials, beryllium copper (BeCu), nickel phosphorous (Ni—P), tungsten (W), aluminum copper (Al—Cu), steel, P7 alloy, palladium, palladium-cobalt, silver, molybdenum, manganese, brass, chrome, chromium copper (Cr—Cu), and combinations of these. Some embodiments may use copper as the structural material with or without a sacrificial material.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003: (1) U.S. Patent Application No. 60/534,184, which is entitled "Electrochemical Fabrication Methods Incorporating Dielectric Materials and/or Using Dielectric Substrates"; (2) U.S. Patent Application No. 60/533,932, which is entitled "Electrochemical Fabrication Methods Using Dielectric Substrates"; (3) U.S. Patent Application No. 60/534,157, which is entitled "Electrochemical Fabrication Methods Incorporating Dielectric Materials"; (4) U.S. Patent Application No. 60/533,891, which is entitled "Methods for Electrochemically Fabricating Structures Incorporating Dielectric Sheets and/or Seed layers That Are Partially Removed Via Planarization"; and (5) U.S. Patent Application No. 60/533,895, which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into electrochemical fabrication processes include: (1) U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; (2) U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates"; (3) U.S. patent application Ser. No. 11/028,957, by Cohen, which was filed on Jan. 3, 2005, now abandoned, and which is entitled "Incorporating Dielectric Materials and/or Using Dielectric Substrates"; (4) U.S. patent application Ser. No. 10/841,300, by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378, by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric"; (6) U.S. patent application Ser. No. 11/325,405, filed Jan. 3, 2006 by Dennis R. Smalley, now abandoned, and which is entitled "Method of Forming Electrically Isolated Structures Using Thin Dielectric Coatings"; (7) U.S. patent application Ser. No. 10/607,931 by Brown, et al., which was filed on Jun. 27, 2003, now U.S. Pat. No. 7,239,219, and which is entitled "Miniature RF and Microwave Components and Methods for Fabricating Such Components", (8) U.S. patent application Ser. No. 10/841,006, by Thompson, et al., which was filed on May 7, 2004, now abandoned, and which is entitled "Electrochemically Fabricated Structures Having Dielectric or Active Bases and Methods of and Apparatus for Producing Such Structures"; (9) U.S. patent application Ser. No. 10/434,295, by Cohen, which was filed on May 7, 2003, now abandoned, and which is entitled "Method of and Apparatus for Forming Three-Dimensional Structures Integral With Semiconductor Based Circuitry"; and (10) U.S. patent application Ser. No. 10/677,556, by Cohen, et al., filed Oct. 1, 2003, now abandoned, and which is entitled "Monolithic Structures Including Alignment and/or Retention Fixtures for Accepting Components". These patent filings are each hereby incorporated herein by reference as if set forth in full herein.

Some embodiments may employ diffusion bonding or the like to enhance adhesion between successive layers of material or to reduce stress. Various teachings concerning the use of diffusion bonding in electrochemical fabrication processes are set forth in US Patent Application Ser. No. 10/841,384, which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, enhanced methods of using may be implemented, and the like.

| U.S. Pat. App No., Filing Date U.S. App Pub No., Pub Date U.S. Pat. No., Pub Date | First Named Inventor, Title |
| --- | --- |
| 10/271,574 - Oct. 15, 2002 2003-0127336 - July 10, 2003 7,288,178 - Oct. 30, 2007 | Cohen, "Methods of and Apparatus for Making High Aspect Ratio Microelectromechanical Structures" |
| 10/387,958 - Mar. 13, 2003 2003-022168 - Dec. 4, 2003 — | Cohen, "Electrochemical Fabrication Method and Application for Producing Three-Dimensional Structures Having Improved Surface Finish" |
| 10/434,289 - May 7, 2003 2004-0065555 - Apr. 8, 2004 | Zhang, "Conformable Contact Masking Methods and Apparatus Utilizing In Situ Cathodic Activation of a Substrate" |
| 10/434,294 - May 7, 2003 2004-0065550 - Apr. 8, 2004 | Zhang, "Electrochemical Fabrication Methods With Enhanced Post Deposition Processing" |
| 10/434,315 - May 7, 2003 2003-0234179 - Dec. 25, 2003 7,229,542 - Jun. 12, 2007 | Bang, "Methods of and Apparatus for Molding Structures Using Sacrificial Metal Patterns" |
| 10/434,494 - May 7, 2003 2004-0000489 - Jan. 1, 2004 — | Zhang, "Methods and Apparatus for Monitoring Deposition Quality During Conformable Contact Mask Plating Operations" |
| 10/677,498 - Oct. 1, 2003 2004-0134788 - Jul. 15, 2004 7,235,166 - Jun. 26, 2007 | Cohen, "Multi-cell Masks and Methods and Apparatus for Using Such Masks To Form Three-Dimensional Structures" |
| 10/697,597 - Dec. 20, 2002 2004-0146650 - Jul. 29, 2004 | Lockard, "EFAB Methods and Apparatus Including Spray Metal or Powder Coating Processes" |
| 10/724,513 - Nov. 26, 2003 2004-0147124 - Jul. 29, 2004 7,368,044 - May 6, 2008 | Cohen, "Non-Conformable Masks and Methods and Apparatus for Forming Three-Dimensional Structures" |
| 10/724,515 - Nov. 26, 2003 2004-0182716 - Sep. 23, 2004 7,291,254 - Nov. 6, 2007 | Cohen, "Method for Electrochemically Forming Structures Including Non-Parallel Mating of Contact Masks and Substrates" |
| 10/830,262 - Apr. 21, 2004 2004-0251142 - Dec. 16, 2004 7,198,704 - Apr. 3, 2007 | Cohen, "Methods of Reducing Interlayer Discontinuities in Electrochemically Fabricated Three-Dimensional Structures" |
| 10/841,100 - May 7, 2004 2005-0032362 - Feb. 10, 2005 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347 - May 7, 2004 2005-0072681 - Apr. 7, 2005 | Cohen, "Multi-step Release Method for Electrochemically Fabricated Structures" |
| 10/949,744 - Sep. 24, 2004 2005-0126916 - Jun. 16, 2005 7,498,714 - Mar. 3, 2009 | Lockard, "Multi-Layer Three-Dimensional Structures Having Features Smaller Than a Minimum Feature Size Associated with the Formation of Individual Layers" |
| 12/345,624 - Dec. 29, 2008 — 8,070,931 - Dec. 6, 2011 | Cohen, "Electrochemical Fabrication Method Including Elastic Joining of Structures" |
| 14/194,564 - Feb. 28, 2014 2014-0238865 - Aug. 28, 2014 9,540,233 - Jan. 10, 2017 | Kumar, "Methods of Forming Three-Dimensional Structures Having Reduced Stress and/or Curvature" |
| 14/720,719 - May 22, 2015 — 9,878,401 - Jan. 30, 2018 | Veeramani, "Methods of Forming Parts Using Laser Machining" |
| 14/872,033 - Sep. 30, 2015 — — | Le, "Multi-Layer, Multi-Material Microscale and Millimeter Scale Batch Part Fabrication Methods Including Disambiguation of Good Parts and Defective Parts" |

Various other embodiments of the present invention exist. Some of these embodiments may be based on a combination of the teachings herein with various teachings incorporated herein by reference. Some method of making embodiments may not use any blanket deposition process and/or they may not use a planarization process. Some embodiments may use selective deposition processes or blanket deposition processes on some layers that are not electrodeposition processes. Some embodiments, for example, may use nickel, nickel-phosphorous, nickel-cobalt, palladium, palladium-cobalt, gold, copper, tin, silver, zinc, solder, rhodium, rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials.

It will be understood by those of skill in the art that additional operations may be used in variations of the above presented method of making embodiments. These additional operations may, for example, perform cleaning functions (e.g. between the primary operations discussed herein or discussed in the various materials incorporated herein by reference), and they may perform activation functions and monitoring functions, and the like.

It will also be understood that the probe elements of some aspects of the invention may be formed with processes which are very different from the processes set forth herein, and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment are intended to apply to all embodiments to the extent that the features of the different embodiments make such applications functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that any aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

I claim:

1. A probe for testing a device under test (DUT), comprising:
   (a) a first tip for making electrical contact to an electrical circuit element, the first tip having a contact region and an attachment region;
   (b) a first extension arm connecting directly or indirectly to the attachment region of the first tip;
   (c) a compliant structure comprising at least one spring segment, wherein a first region of the compliant structure joins the first extension arm;
   (d) a second extension arm joining a second region of the compliant structure such that relative displacement of the first and second extension arms results in elastic movement of the at least one spring segment of the compliant structure;
   (e) a second tip having a first attachment region and a second region wherein the first attachment region of the second tip joins the second extension arm; and
   (f) a guidance structure that limits elastic movement of the compliant structure to substantially longitudinal movement along a longitudinal axis of the probe,
   wherein the at least one spring segment operates under tension to provide an elastic restoration force,
   wherein the second region of the second tip is configured for making an electrical connection to a second circuit element, wherein the configuration is selected from a group consisting of: (1) a tip for making a contact connection, and (2) a tip for making an attached connection,
   wherein the probe further comprises at least two movable stop structures to allow pre-biasing of the at least one spring segment, and
   wherein the at least two movable stop structures each include a respective opening through which one of the first extension arm or the second extension arm can pass.

2. The probe of claim 1, wherein the at least one spring segment comprises a plurality of spring segments.

3. The probe of claim 1, wherein the at least one spring segment comprises a plurality of spring segments with at least one of the plurality of spring segments operating under compression to provide a restoring force.

4. The probe of claim 1, wherein the probe additionally comprises features that can engage with features on an array structure to allow for pre-biasing of the at least one spring segment.

5. The probe of claim 1, wherein the at least one spring segment comprises a metal and is provided in a flat spring configuration.

6. The probe of claim 1, wherein the at least one spring segment comprises at least two spring segments that are joined together in a serial configuration.

7. The probe of claim 6, wherein the at least two spring segments are flat spring segments and are spaced from one another but at least partially overlay one another in a face-to-face configuration.

8. The probe of claim 6, wherein the at least two spring segments are flat springs and are separated from one another by an intermediate surface against which at least one of the spring segments can slide.

9. The probe of claim 6, wherein the at least two joined spring segments operate in tension.

10. The probe of claim 6, wherein at least one of the at least two joined segments operate in tension while another of the at least two joined segments operates in compression.

11. The probe of claim 1, wherein the probe comprises a sheath in which at least a portion of the at least one spring segment of the compliant structure moves.

12. A probe for testing a device under test (DUT), comprising:
   (a) a first tip for making electrical contact to an electrical circuit element, the first tip having a first contact region and a first connection region;
   (b) a first extension arm connecting directly or indirectly to the first connection region of the first tip;
   (c) a compliant structure comprising at least one spring segment, and wherein a first region of the compliant structure connects directly or indirectly to the first extension arm;
   (d) a second extension arm connecting directly or indirectly to a second connection region of the compliant structure such that relative displacement of the first extension arm and the second extension arm results in elastic movement of the at least one spring segment of the compliant structure;
   (e) a second tip having a first connection region and a second region wherein the first connection region joins the second extension arm; and
   (f) at least one guidance element that limits relative movement of the first tip and the second tip along a substantially longitudinal axis of the probe,
   wherein the at least one spring segment undergoes increased extension upon relative displacement of the first tip and the second tip toward one another along a longitudinal axis of the probe,
   wherein the second region of the second tip is configured for making an electrical connection to a second circuit element, wherein the configuration is selected from a group consisting of: (1) a tip for making a contact connection, and (2) a tip for making an attached connection,
   wherein the probe further comprises at least two movable stop structures to allow pre-biasing of the at least one spring segment, and
   wherein the at least two movable stop structures each include a respective opening through which one of the first extension arm or the second extension arm can pass.

13. A probe for testing a device under test (DUT), comprising:
   (a) a first tip for making electrical contact to an electrical circuit element, the first tip having a first contact region and a first connection region;
   (b) a first extension arm connecting directly or indirectly to the first connection region of the first tip;
   (c) a compliant structure comprising at least one spring segment, and wherein a first region of the compliant structure connects directly or indirectly to the first extension arm;
   (d) a second extension arm connecting directly or indirectly to a second connection region of the compliant structure such that relative displacement of the first extension arm and the second extension arm results in elastic movement of the at least one spring segment of the compliant structure; and
   (e) a second tip having a first connection region and a second region wherein the first connection region joins the second extension arm,
   wherein the at least one spring segment undergoes increased extension upon relative displacement of the first tip and the second tip toward one another along a longitudinal axis of the probe,
   wherein the second region of the second tip is configured for making an electrical connection to a second circuit element, wherein the configuration is selected from a group consisting of: (1) a tip for making a contact connection, and (2) a tip for making an attached connection,
   wherein the probe further comprises at least two movable stop structures to allow pre-biasing of the at least one spring segment, and
   wherein the at least two movable stop structures each include a respective opening through which one of the first extension arm or the second extension arm can pass.

14. The probe of claim 13, wherein the probe additionally comprises at least one structure that is directly or indirectly attached to an end of the at least one spring segment for providing a function selected from the group consisting of: (1) providing a stop structure that moves with the end of the at least one spring segment as a first tip and second tip are moved relative to one another; and (2) providing for relative longitudinal motion of the first tip relative to the second tip while inhibiting excessive lateral motion of at least one of the first tip or the second tip.

15. The probe of claim 13, wherein the probe additionally comprises a rigid probe body providing a frame which supports a relative lateral positioning of the compliant structure, the first extension arm, and the second tip extension arm while allowing at least one of the first extension arm and first tip or the second extension arm and second tip to move longitudinally, via an external compressive force applied to the first and/or second tips, through a working range of longitudinally extended probe length to longitudinally compressed probe length while increasing a tensional force on the at least one spring segment and moving longitudinally through a working range of longitudinally compressed probe length to extended probe length under a force of extension provided, at least in part, by the tensional force stored in the at least one spring segment, wherein the rigid probe body extends from at least one end of the at least one spring segment to the other end of the at least one spring segment at a full working extension of the at least one spring segment.

* * * * *